United States Patent
Lempkowski

(10) Patent No.: US 6,714,768 B2
(45) Date of Patent: Mar. 30, 2004

(54) STRUCTURE AND METHOD FOR FABRICATING SEMICONDUCTOR STRUCTURES AND POLARIZATION MODULATOR DEVICES UTILIZING THE FORMATION OF A COMPLIANT SUBSTRATE

(75) Inventor: Robert Lempkowski, Elk Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/921,900

(22) Filed: Aug. 6, 2001

(65) Prior Publication Data

US 2003/0027361 A1 Feb. 6, 2003

(51) Int. Cl.[7] .................. H04B 1/02; H03C 7/02; H01L 21/31
(52) U.S. Cl. .................. 455/101; 455/276.1; 455/68; 438/779
(58) Field of Search .................. 455/101, 103, 455/115, 126, 232.1, 234.1, 241.1, 242.1, 242.2, 245.1, 246.1, 272–275, 276.1, 277.1, 249.1, 60, 67.1, 67.6, 68; 438/779; 257/295, 347, 506; 343/853

(56) References Cited

U.S. PATENT DOCUMENTS

| | | | |
|---|---|---|---|
| 4,723,321 A | * 2/1988 | Saleh | 455/295 |
| 5,760,740 A | * 6/1998 | Blodgett | 342/362 |
| 6,181,920 B1 | * 1/2001 | Dent et al. | 455/101 |
| 6,233,435 B1 | * 5/2001 | Wong | 455/103 |
| 6,415,140 B1 | * 7/2002 | Benjamin et al. | 455/275 |
| 6,427,066 B1 | * 7/2002 | Grube | 455/73 |

* cited by examiner

Primary Examiner—Duc M. Nguyen
(74) Attorney, Agent, or Firm—Oblon, Spivak, McClelland, Maier & Neustadt, P.C.

(57) ABSTRACT

Polarization modulator devices can be formed to take advantage of multi-layered semiconductor structures. High quality epitaxial layers of monocrystalline materials can be grown overlying monocrystalline substrates such as large silicon wafers by forming a compliant substrate for growing the monocrystalline layers. An accommodating buffer layer comprises a layer of monocrystalline oxide spaced apart from a silicon wafer by an amorphous interface layer of silicon oxide. The amorphous interface layer dissipates strain and permits the growth of a high quality monocrystalline oxide accommodating buffer layer. The accommodating buffer layer is lattice matched to both the underlying silicon wafer and the overlying monocrystalline material layer. Any lattice mismatch between the accommodating buffer layer and the underlying silicon substrate is taken care of by the amorphous interface layer.

4 Claims, 14 Drawing Sheets

STRUCTURE AND METHOD FOR FABRICATING SEMICONDUCTOR STRUCTURES AND POLARIZATION MODULATOR DEVICES UTILIZING THE FORMATION OF A COMPLIANT SUBSTRATE

FIELD OF THE INVENTION

This invention relates generally to semiconductor structures and polarization modulator devices and to a method for their fabrication, and more specifically to semiconductor structures and polarization modulator devices and to the fabrication and use of semiconductor structures, devices, and integrated circuits that include a monocrystalline material layer comprised of semiconductor material, compound semiconductor material, and/or other types of material such as metals and non-metals.

BACKGROUND OF THE INVENTION

Semiconductor devices often include multiple layers of conductive, insulating, and semiconductive layers. Often, the desirable properties of such layers improve with the crystallinity of the layer. For example, the electron mobility and band gap of semiconductive layers improves as the crystallinity of the layer increases. Similarly, the free electron concentration of conductive layers and the electron charge displacement and electron energy recoverability of insulative or dielectric films improves as the crystallinity of these layers increases.

For many years, attempts have been made to grow various monolithic thin films on a foreign substrate such as silicon (Si). To achieve optimal characteristics of the various monolithic layers, however, a monocrystalline film of high crystalline quality is desired. Attempts have been made, for example, to grow various monocrystalline layers on a substrate such as germanium, silicon, and various insulators. These attempts have generally been unsuccessful because lattice mismatches between the host crystal and the grown crystal have caused the resulting layer of monocrystalline material to be of low crystalline quality.

If a large area thin film of high quality monocrystalline material was available at low cost, a variety of semiconductor devices could advantageously be fabricated in or using that film at a low cost compared to the cost of fabricating such devices beginning with a bulk wafer of semiconductor material or in an epitaxial film of such material on a bulk wafer of semiconductor material. In addition, if a thin film of high quality monocrystalline material could be realized beginning with a bulk wafer such as a silicon wafer, an integrated device structure could be achieved that took advantage of the best properties of both the silicon and the high quality monocrystalline material.

Accordingly, a need exists for a semiconductor structure that provides a high quality monocrystalline film or layer over another monocrystalline material and for a process for making such a structure. In other words, there is a need for providing the formation of a monocrystalline substrate that is compliant with a high quality monocrystalline material layer so that true two-dimensional growth can be achieved for the formation of quality semiconductor structures, devices and integrated circuits having grown monocrystalline film having the same crystal orientation as an underlying substrate. This monocrystalline material layer may be comprised of a semiconductor material, a compound semiconductor material, and other types of material such as metals and non-metals.

Present devices for arbitrary polarization generation use phase shifting and amplitude attenuation networks. Such networks are typically slow for precision. Slow components restrict the information transfer rate, so that polarization modulation is not practical for most applications. In addition, polar modulation is restricted to limited states of polarization and cannot reverse polarization. Polarization can be visualized using a Poincare sphere, which represents all states of polarization. Each point on the surface of the sphere corresponds to a state of polarization. Linear polarization is represented by the points on the equator and circular polarization is represented by the two poles. Present devices operating in one hemisphere of the Poincare sphere, such as the northern hemisphere, cannot readily switch to the opposite, southern hemisphere.

Accordingly, a need exists for a polarization modulator providing variable polarization over all states of polarization to maximize signal reception or transmission, regardless of antenna orientation. Further, the need exists for a polarization modulator providing polar modulation over all states of polarization to provide additional information transfer capability.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
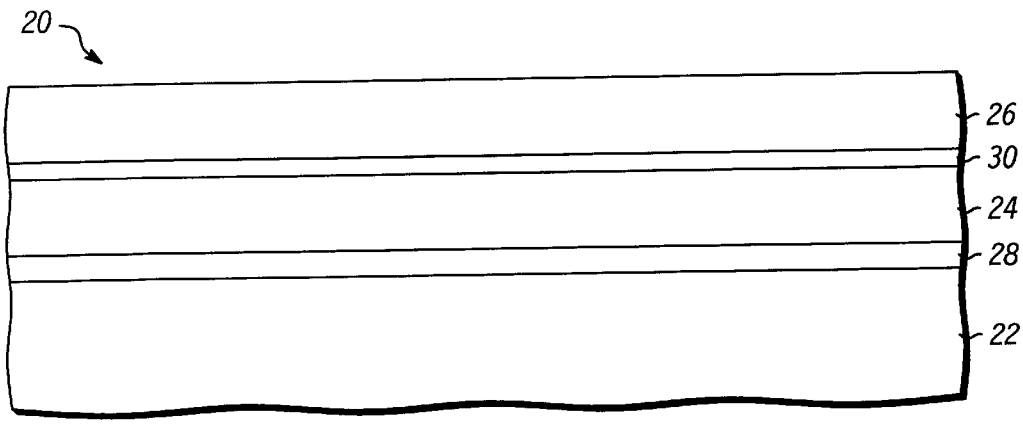
FIGS. 1, 2, and 3 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and a monocrystalline material layer 26. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and monocrystalline material layer 26. As will be explained more fully below, the template layer helps to initiate the growth of the monocrystalline material layer on the accommodating buffer layer. The amorphous intermediate layer helps to relieve the strain in the accommodating buffer layer and by doing so, aids in the growth of a high crystalline quality accommodating buffer layer.

Substrate 22, in accordance with an embodiment of the invention, is a monocrystalline semiconductor or compound semiconductor wafer, preferably of large diameter. The wafer can be of, for example, a material from Group IV of the periodic table. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline material layer 26 which may comprise a semiconductor material, a compound semiconductor material, or another type of material such as a metal or a non-metal.

Accommodating buffer layer 24 is preferably a monocrystalline oxide or nitride material selected for its crystalline compatibility with the underlying substrate and with the overlying material layer. For example, the material could be an oxide or nitride having a lattice structure closely matched to the substrate and to the subsequently applied monocrystalline material layer. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitrides may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The material for monocrystalline material layer 26 can be selected, as desired, for a particular structure or application. For example, the monocrystalline material of layer 26 may comprise a compound semiconductor which can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like. However, monocrystalline material layer 26 may also comprise other semiconductor materials, metals, or non-metal materials which are used in the formation of semiconductor structures, devices and/or integrated circuits.

Appropriate materials for template 30 are discussed below. Suitable template materials chemically bond to the surface of the accommodating buffer layer 24 at selected sites and provide sites for the nucleation of the epitaxial growth of monocrystalline material layer 26. When used, template layer 30 has a thickness ranging from about 1 to about 10 monolayers.

Figure 2:
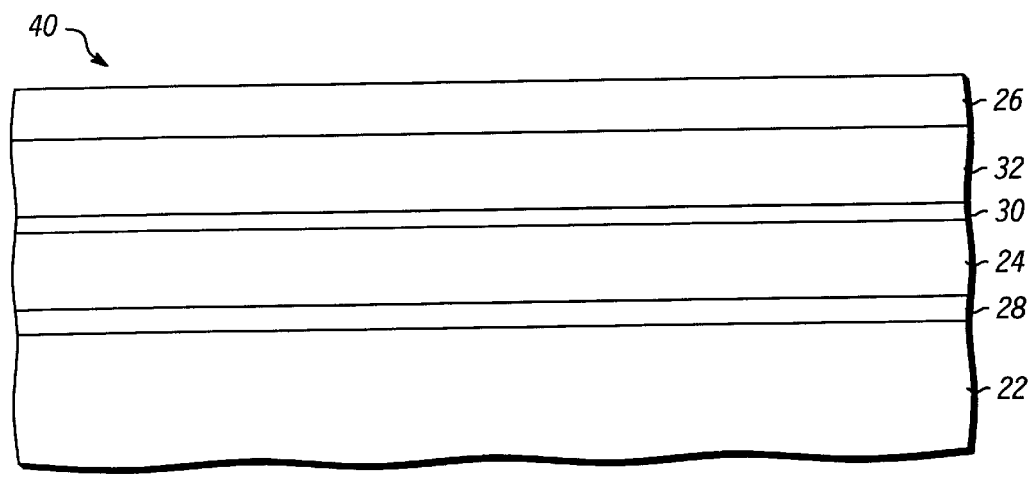

FIG. 2 illustrates, in cross section, a portion of a semiconductor structure 40 in accordance with a further embodiment of the invention. Structure 40 is similar to the previously described semiconductor structure 20, except that an additional buffer layer 32 is positioned between accommodating buffer layer 24 and monocrystalline material layer 26.

Specifically, the additional buffer layer is positioned between template layer 30 and the overlying layer of monocrystalline material. The additional buffer layer, formed of a semiconductor or compound semiconductor material when the monocrystalline material layer 26 comprises a semiconductor or compound semiconductor material, serves to provide a lattice compensation when the lattice constant of the accommodating buffer layer cannot be adequately matched to the overlying monocrystalline semiconductor or compound semiconductor material layer.

Figure 3:
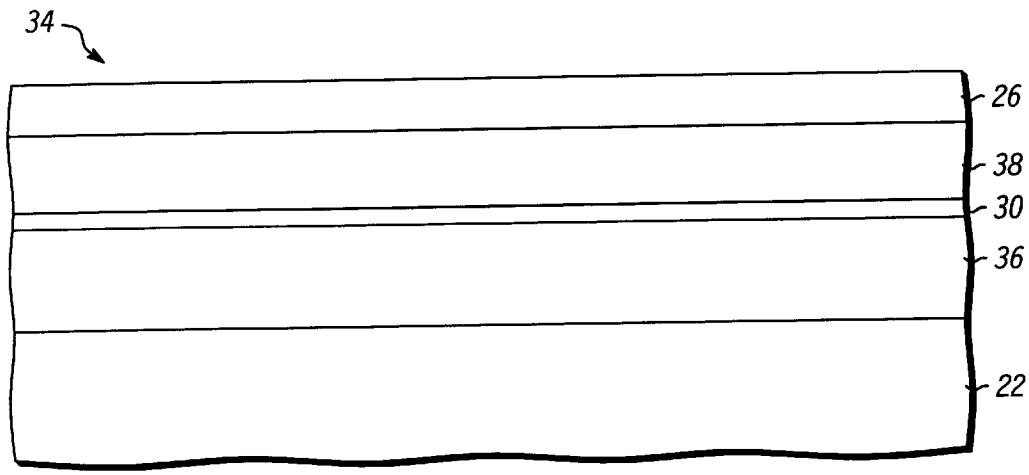

FIG. 3 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional monocrystalline layer 38.

As explained in greater detail below, amorphous layer 36 may be formed by first forming an accommodating buffer layer and an amorphous interface layer in a similar manner to that described above. Monocrystalline layer 38 is then formed (by epitaxial growth) overlying the monocrystalline accommodating buffer layer. The accommodating buffer layer is then exposed to an anneal process to convert the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and additional monocrystalline layer 26 (subsequent to layer 38 formation) relieves stresses between layers 22 and 38 and provides a true compliant substrate for subsequent processing—e.g., monocrystalline material layer 26 formation.

The processes previously described above in connection with FIGS. 1 and 2 are adequate for growing monocrystalline material layers over a monocrystalline substrate. However, the process described in connection with FIG. 3, which includes transforming a monocrystalline accommodating buffer layer to an amorphous oxide layer, may be better for growing monocrystalline material layers because it allows any strain in layer 26 to relax.

Additional monocrystalline layer 38 may include any of the materials described throughout this application in connection with either of monocrystalline material layer 26 or additional buffer layer 32. For example, when monocrystalline material layer 26 comprises a semiconductor or compound semiconductor material, layer 38 may include monocrystalline Group IV or monocrystalline compound semiconductor materials.

In accordance with one embodiment of the present invention, additional monocrystalline layer 38 serves as an anneal cap during layer 36 formation and as a template for subsequent monocrystalline layer 26 formation. Accordingly, layer 38 is preferably thick enough to provide a suitable template for layer 26 growth (at least one monolayer) and thin enough to allow layer 38 to form as a substantially defect free monocrystalline material.

In accordance with another embodiment of the invention, additional monocrystalline layer 38 comprises monocrystalline material (e.g., a material discussed above in connection with monocrystalline layer 26) that is thick enough to form devices within layer 38. In this case, a semiconductor structure in accordance with the present invention does not include monocrystalline material layer 26. In other words, the semiconductor structure in accordance with this embodiment only includes one monocrystalline layer disposed above amorphous oxide layer 36.

The following non-limiting, illustrative examples illustrate various combinations of materials useful in structures 20, 40, and 34 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 26. The accommodating buffer layer can have a thickness of about 2 to about 100 nanometers (nm) and preferably has a thickness of about 5 nm. In general, it is desired to have an accommodating buffer layer thick enough to isolate the monocrystalline material layer 26 from the substrate to obtain the desired electrical and optical properties. Layers thicker than 100 nm usually provide little additional benefit while increasing cost unnecessarily; however, thicker layers may be fabricated if needed. The amorphous intermediate layer of silicon oxide can have a thickness of about 0.5–5 mn, and preferably a thickness of about 1 to 2 mn.

In accordance with this embodiment of the invention, monocrystalline material layer 26 is a compound semiconductor layer of gallium arsenide (GaAs) or aluminum gallium arsenide (AlGaAs) having a thickness of about 1 mn to about 100 micrometers ($\mu$m) and preferably a thickness of about 0.5 $\mu$m to 10 $\mu$m. The thickness generally depends on the application for which the layer is being prepared. To facilitate the epitaxial growth of the gallium arsenide or aluminum gallium arsenide on the monocrystalline oxide, a template layer is formed by capping the oxide layer. The template layer is preferably 1–10 monolayers of Ti—As, Sr—O—As, Sr—Ga—O, or Sr—Al—O. By way of a preferred example, 1–2 monolayers of Ti—As or Sr—Ga—O have been illustrated to successfully grow GaAs layers.

EXAMPLE 2

In accordance with a further embodiment of the invention, monocrystalline substrate 22 is a silicon substrate as described above. The accommodating buffer layer is a monocrystalline oxide of strontium or barium zirconate or hafflate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 5 nm to ensure adequate crystalline and surface quality and is formed of a monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a 45 degree rotation with respect to the substrate silicon lattice structure.

An accommodating buffer layer formed of these zirconate or hafnate materials is suitable for the growth of a monocrystalline material layer which comprises compound semiconductor materials in the indium phosphide (InP) system. In this system, the compound semiconductor material can be, for example, indium phosphide (InP), indium gallium arsenide (InGaAs), aluminum indium arsenide, (AlInAs), or aluminum gallium indium arsenic phosphide (AlGaInAsP), having a thickness of about 1.0 nm to 10 µm. A suitable template for this structure is 1–10 monolayers of zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indium-strontium-oxygen (In—Sr—O), or barium-oxygen-phosphorus (Ba—O—P), and preferably 1–2 monolayers of one of these materials. By way of an example, for a barium zirconate accommodating buffer layer, the surface is terminated with 1–2 monolayers of zirconium followed by deposition of 1–2 monolayers of arsenic to form a Zr—As template. A monocrystalline layer of the compound semiconductor material from the indium phosphide system is then grown on the template layer. The resulting lattice structure of the compound semiconductor material exhibits a 45 degree rotation with respect to the accommodating buffer layer lattice structure and a lattice mismatch to (100) InP of less than 2.5%, and preferably less than about 1.0%.

EXAMPLE 3

In accordance with a further embodiment of the invention, a structure is provided that is suitable for the growth of an epitaxial film of a monocrystalline material comprising a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 5–15 nm. Where the monocrystalline layer comprises a compound semiconductor material, the II–VI compound semiconductor material can be, for example, zinc selenide (ZnSe) or zinc sulfur selenide (ZnSSe). A suitable template for this material system includes 1–10 monolayers of zinc-oxygen (Zn—O) followed by 1–2 monolayers of an excess of zinc followed by the selenidation of zinc on the surface. Alternatively, a template can be, for example, 1–10 monolayers of strontium-sulfur (Sr—S) followed by the ZnSeS.

EXAMPLE 4

This embodiment of the invention is an example of structure 40 illustrated in FIG. 2. Substrate 22, accommodating buffer layer 24, and monocrystalline material layer 26 can be similar to those described in example 1. In addition, an additional buffer layer 32 serves to alleviate any strains that might result from a mismatch of the crystal lattice of the accommodating buffer layer and the lattice of the monocrystalline material. Buffer layer 32 can be a layer of germanium or a GaAs, an aluminum gallium arsenide (AlGaAs), an indium gallium phosphide (InGaP), an aluminum gallium phosphide (AlGaP), an indium gallium arsenide (InGaAs), an aluminum indium phosphide (AlInP), a gallium arsenide phosphide (GaAsP), or an indium gallium phosphide (InGaP) strain compensated superlattice. In accordance with one aspect of this embodiment, buffer layer 32 includes a $GaAs_xP_{1-x}$ superlattice, wherein the value of x ranges from 0 to 1. In accordance with another aspect, buffer layer 32 includes an $In_yGa_{1-y}P$ superlattice, wherein the value of y ranges from 0 to 1. By varying the value of x or y, as the case may be, the lattice constant is varied from bottom to top across the superlattice to create a match between lattice constants of the underlying oxide and the overlying monocrystalline material which in this example is a compound semiconductor material. The compositions of other compound semiconductor materials, such as those listed above, may also be similarly varied to manipulate the lattice constant of layer 32 in a like manner. The superlattice can have a thickness of about 50–500 nm and preferably has a thickness of about 100–200 mn. The template for this structure can be the same of that described in example 1. Alternatively, buffer layer 32 can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about one monolayer can be used as a nucleating site for the subsequent growth of the monocrystalline material layer which in this example is a compound semiconductor material. The formation of the oxide layer is capped with either a monolayer of strontium or a monolayer of titanium to act as a nucleating site for the subsequent deposition of the monocrystalline germanium. The monolayer of strontium or titanium provides a nucleating site to which the first monolayer of germanium can bond.

EXAMPLE 5

This example also illustrates materials useful in a structure 40 as illustrated in FIG. 2. Substrate material 22, accommodating buffer layer 24, monocrystalline material layer 26 and template layer 30 can be the same as those described above in example 2. In addition, additional buffer layer 32 is inserted between the accommodating buffer layer and the overlying monocrystalline material layer. The buffer layer, a further monocrystalline material which in this instance comprises a semiconductor material, can be, for example, a graded layer of indium gallium arsenide (InGaAs) or indium aluminum arsenide (InAlAs). In accordance with one aspect of this embodiment, additional buffer layer 32 includes InGaAs, in which the indium composition varies from 0 to about 50%. The additional buffer layer 32 preferably has a thickness of about 10–30 nm. Varying the composition of the buffer layer from GaAs to InGaAs serves to provide a lattice match between the underlying monocrystalline oxide material and the overlying layer of monocrystalline material which in this example is a compound semiconductor material. Such a buffer layer is especially advantageous if there is a lattice mismatch between accommodating buffer layer 24 and monocrystalline material layer 26.

EXAMPLE 6

This example provides exemplary materials useful in structure 34, as illustrated in FIG. 3. Substrate material 22, template layer 30, and monocrystalline material layer 26 may be the same as those described above in connection with example 1.

Amorphous layer 36 is an amorphous oxide layer which is suitably formed of a combination of amorphous intermediate layer materials (e.g., layer 28 materials as described above) and accommodating buffer layer materials (e.g., layer 24 materials as described above). For example, amorphous layer 36 may include a combination of $SiO_x$ and $Sr_zBa_{1-z}TiO_3$ (where z ranges from 0 to 1),which combine or mix, at least partially, during an anneal process to form amorphous oxide layer 36.

The thickness of amorphous layer 36 may vary from application to application and may depend on such factors as desired insulating properties of layer 36, type of monocrystalline material comprising layer 26, and the like. In accordance with one exemplary aspect of the present embodiment, layer 36 thickness is about 2 nm to about 100 nm, preferably about 2–10 nm, and more preferably about 5–6 nm.

Layer 38 comprises a monocrystalline material that can be grown epitaxially over a monocrystalline oxide material such as material used to form accommodating buffer layer 24. In accordance with one embodiment of the invention, layer 38 includes the same materials as those comprising layer 26. For example, if layer 26 includes GaAs, layer 38 also includes GaAs. However, in accordance with other embodiments of the present invention, layer 38 may include materials different from those used to form layer 26. In accordance with one exemplary embodiment of the invention, layer 38 is about 1 monolayer to about 100 nm thick.

Referring again to FIGS. 1–3, substrate 22 is a monocrystalline substrate such as a monocrystalline silicon or gallium arsenide substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
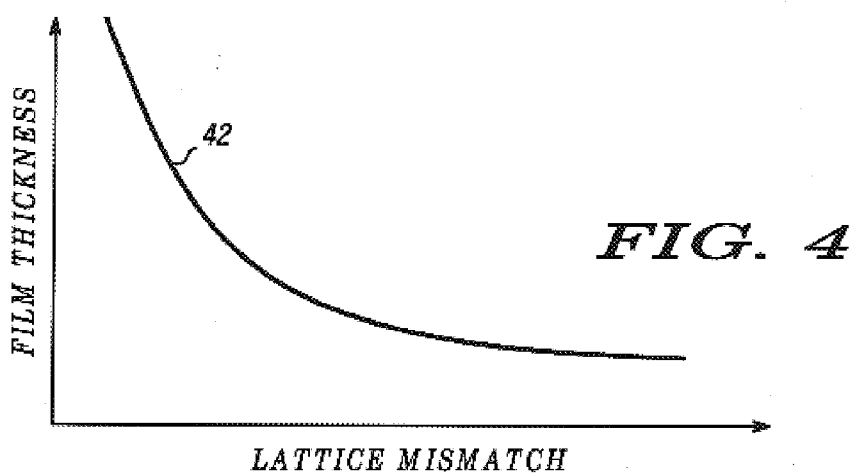
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that have a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material by 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Still referring to FIGS. 1–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. For example, if the grown crystal is gallium arsenide, aluminum gallium arsenide, zinc selenide, or zinc sulfur selenide and the accommodating buffer layer is monocrystalline $Sr_xBa_{1-x}TiO_3$, substantial matching of crystal lattice constants of the two materials is achieved, wherein the crystal orientation of the grown layer is rotated by 45° with respect to the orientation of the host monocrystalline oxide. Similarly, if the host material is a strontium or barium zirconate or a strontium or barium hafnate or barium tin oxide and the compound semiconductor layer is indium phosphide or gallium indium arsenide or aluminum indium arsenide, substantial matching of crystal lattice constants can be achieved by rotating the orientation of the grown crystal layer by 45° with respect to the host oxide crystal. In some instances, a crystalline semiconductor buffer layer between the host oxide and the grown monocrystalline material layer can be used to reduce strain in the grown monocrystalline material layer that might result from small differences in lattice constants. Better crystalline quality in the grown monocrystalline material layer can thereby be achieved.

The following example illustrates a process, in accordance with one embodiment of the invention, for fabricating a semiconductor structure such as the structures depicted in FIGS. 1–3. The process starts by providing a monocrystalline semiconductor substrate comprising silicon or germanium. In accordance with a preferred embodiment of the invention, the semiconductor substrate is a silicon wafer having a (100) orientation. The substrate is preferably oriented on axis or, at most, about 4° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkaline earth metals or combinations of alkaline earth metals in an MBE apparatus. In the case where strontium is used, the substrate is then heated to a temperature of about 750° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkaline earth metal oxide, such as strontium oxide, strontium barium oxide, or barium oxide, onto the substrate surface by MBE at a low temperature and by subsequently heating the structure to a temperature of about 750° C. At this temperature a solid state reaction takes place between the strontium oxide and the native silicon oxide causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–800° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered (100) monocrystal with the (100) crystalline orientation rotated by 45° with respect to the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired monocrystalline material. For example, for the subsequent growth of a monocrystalline compound semiconductor material layer of gallium arsenide, the MBE growth of the strontium titanate monocrystalline layer can be capped by terminating the growth with 1–2 monolayers of titanium, 1–2 monolayers of titanium-oxygen or with 1–2 monolayers of strontium-oxygen. Following the formation of this capping layer, arsenic is deposited to form a Ti—As bond, a Ti—O—As bond or a Sr—O—As. Any of these form an appropriate template for deposition and formation of a gallium arsenide monocrystalline layer. Following the formation of the template, gallium is subsequently introduced to the reaction with the arsenic and gallium arsenide forms. Alternatively, gallium can be deposited on the capping layer to form a Sr—O—Ga bond, and arsenic is subsequently introduced with the gallium to form the GaAs.

Figure 5:
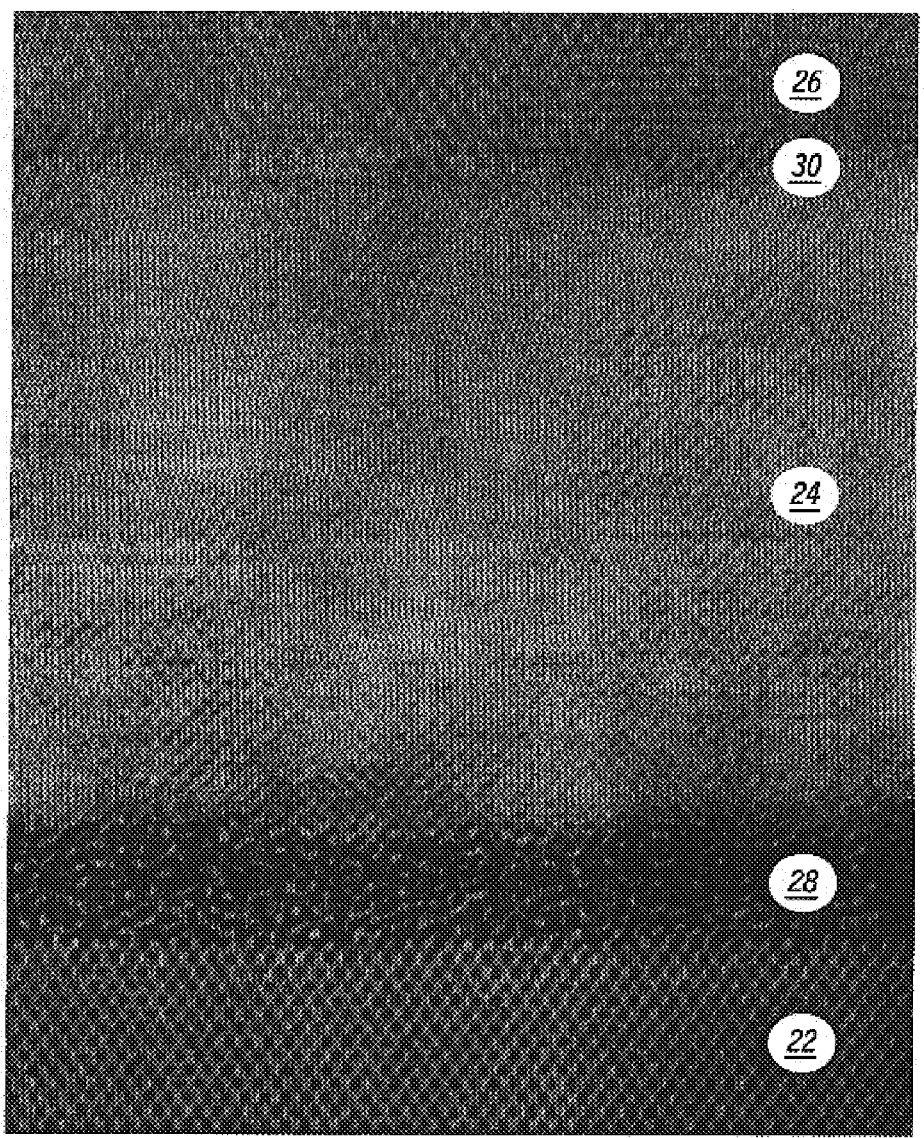
FIG. 5 illustrates a high resolution Transmission Electron Micrograph of a structure including a monocrystalline accommodating buffer layer.

FIG. 5 is a high resolution Transmission Electron Micrograph (TEM) of semiconductor material manufactured in accordance with one embodiment of the present invention. Single crystal $SrTiO_3$ accommodating buffer layer 24 was grown epitaxially on silicon substrate 22. During this growth process, amorphous interfacial layer 28 is formed which relieves strain due to lattice mismatch. GaAs compound semiconductor layer 26 was then grown epitaxially using template layer 30.

Figure 6:
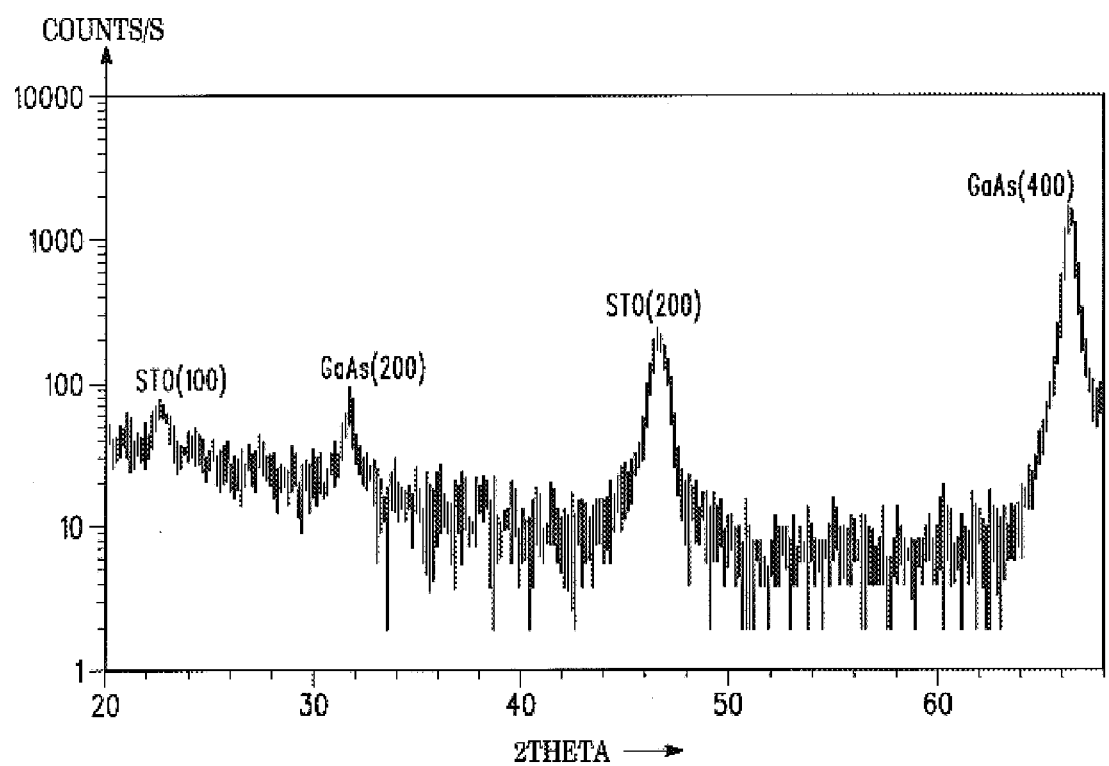
FIG. 6 illustrates an x-ray diffraction spectrum of a structure including a monocrystalline accommodating buffer layer.

FIG. 6 illustrates an x-ray diffraction spectrum taken on a structure including GaAs monocrystalline layer 26 comprising GaAs grown on silicon substrate 22 using accommodating buffer layer 24. The peaks in the spectrum indicate that both the accommodating buffer layer 24 and GaAs compound semiconductor layer 26 are single crystal and (100) orientated.

The structure illustrated in FIG. 2 can be formed by the process discussed above with the addition of an additional buffer layer deposition step. The additional buffer layer 32 is formed overlying the template layer before the deposition of the monocrystalline material layer. If the buffer layer is a monocrystalline material comprising a compound semiconductor superlattice, such a superlattice can be deposited, by MBE for example, on the template described above. If instead the buffer layer is a monocrystalline material layer comprising a layer of germanium, the process above is modified to cap the strontium titanate monocrystalline layer with a final layer of either strontium or titanium and then by depositing germanium to react with the strontium or titanium. The germanium buffer layer can then be deposited directly on this template.

Structure 34, illustrated in FIG. 3, may be formed by growing an accommodating buffer layer, forming an amorphous oxide layer over substrate 22, and growing semiconductor layer 38 over the accommodating buffer layer, as described above. The accommodating buffer layer and the amorphous oxide layer are then exposed to an anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer, the amorphous oxide layer, and monocrystalline layer 38 to a rapid thermal anneal process with a peak temperature of about 700° C. to about 1000° C. and a process time of about 5 seconds to about 10 minutes. However, other suitable anneal processes may be employed to convert the accommodating buffer layer to an amorphous layer in accordance with the present invention. For example, laser annealing, electron beam annealing, or "conventional" thermal annealing processes (in the proper environment)

may be used to form layer 36. When conventional thermal annealing is employed to form layer 36, an overpressure of one or more constituents of layer 30 may be required to prevent degradation of layer 38 during the anneal process. For example, when layer 38 includes GaAs, the anneal environment preferably includes an overpressure of arsenic to mitigate degradation of layer 38.

As noted above, layer 38 of structure 34 may include any materials suitable for either of layers 32 or 26. Accordingly, any deposition or growth methods described in connection with either layer 32 or 26, may be employed to deposit layer 38.

Figure 7:
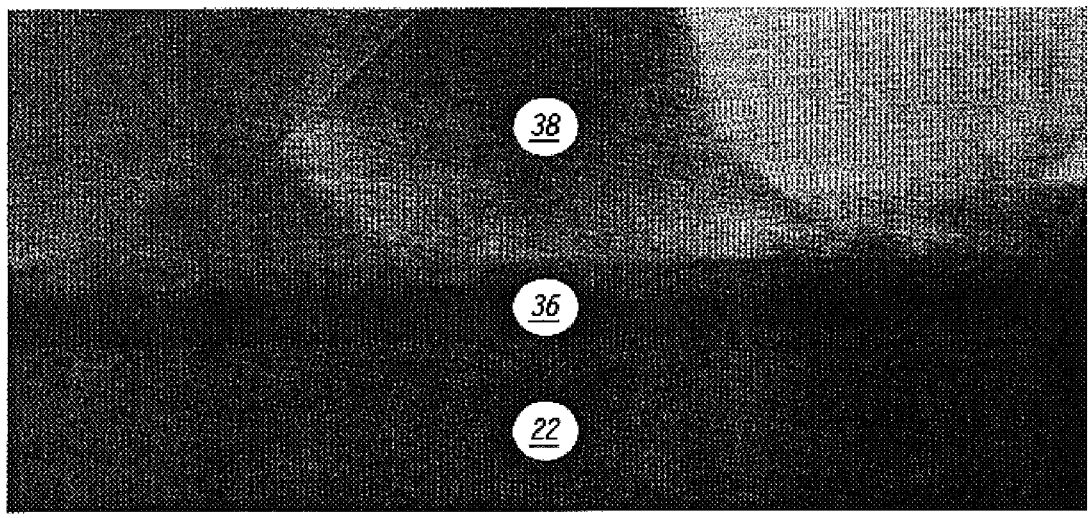
FIG. 7 illustrates a high resolution Transmission Electron Micrograph of a structure including an amorphous oxide layer.

FIG. 7 is a high resolution TEM of semiconductor material manufactured in accordance with the embodiment of the invention illustrated in FIG. 3. In accordance with this embodiment, a single crystal $SrTiO_3$ accommodating buffer layer was grown epitaxially on silicon substrate 22. During this growth process, an amorphous interfacial layer forms as described above. Next, additional monocrystalline layer 38 comprising a compound semiconductor layer of GaAs is formed above the accommodating buffer layer and the accommodating buffer layer is exposed to an anneal process to form amorphous oxide layer 36.

Figure 8:
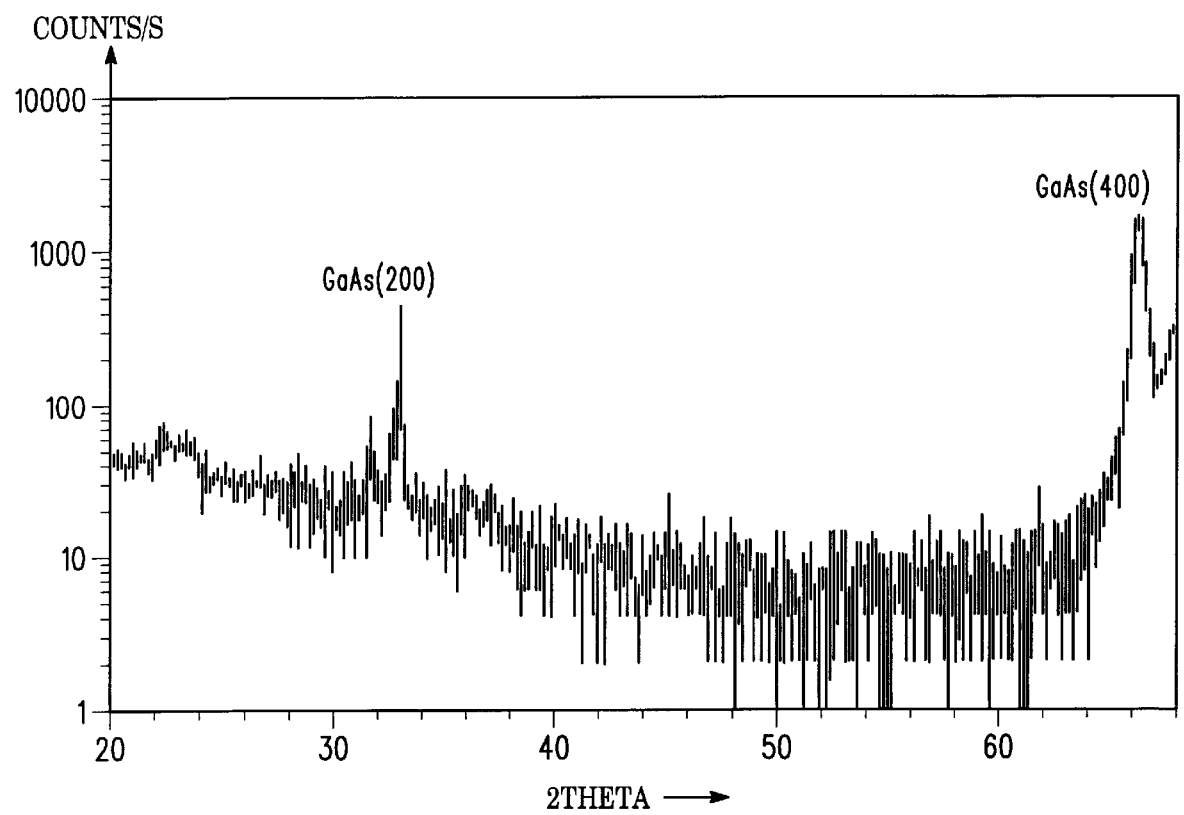
FIG. 8 illustrates an x-ray diffraction spectrum of a structure including an amorphous oxide layer.

FIG. 8 illustrates an x-ray diffraction spectrum taken on a structure including additional monocrystalline layer 38 comprising a GaAs compound semiconductor layer and amorphous oxide layer 36 formed on silicon substrate 22. The peaks in the spectrum indicate that GaAs compound semiconductor layer 38 is single crystal and (100) orientated and the lack of peaks around 40 to 50 degrees indicates that layer 36 is amorphous.

The process described above illustrates a process for forming a semiconductor structure including a silicon substrate, an overlying oxide layer, and a monocrystalline material layer comprising a gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, and niobates alkaline earth metal tin-based perovskites, lanthanum aluminate, lanthanum scandium oxide, and gadolinium oxide can also be grown. Further, by a similar process such as MBE, other monocrystalline material layers comprising other III–V and II–VI monocrystalline compound semiconductors, semiconductors, metals and non-metals can be deposited overlying the monocrystalline oxide accommodating buffer layer.

Each of the variations of monocrystalline material layer and monocrystalline oxide accommodating buffer layer uses an appropriate template for initiating the growth of the monocrystalline material layer. For example, if the accommodating buffer layer is an alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide respectively. Similarly, if the monocrystalline oxide accommodating buffer layer is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer, respectively. In a similar manner, strontium titanate can be capped with a layer of strontium or strontium and oxygen and barium titanate can be capped with a layer of barium or barium and oxygen. Each of these depositions can be followed by the deposition of arsenic or phosphorus to react with the capping material to form a template for the deposition of a monocrystalline material layer comprising compound semiconductors such as indium gallium arsenide, indium aluminum arsenide, or indium phosphide.

The formation of a device structure in accordance with another embodiment of the invention is illustrated schematically in cross-section in FIGS. 9–12. Like the previously described embodiments referred to in FIGS. 1–3, this embodiment of the invention involves the process of forming a compliant substrate utilizing the epitaxial growth of single crystal oxides, such as the formation of accommodating buffer layer 24 previously described with reference to FIGS. 1 and 2 and amorphous layer 36 previously described with reference to FIG. 3, and the formation of a template layer 30. However, the embodiment illustrated in FIGS. 9–12 utilizes a template that includes a surfactant to facilitate layer-by-layer monocrystalline material growth.

Figure 9:
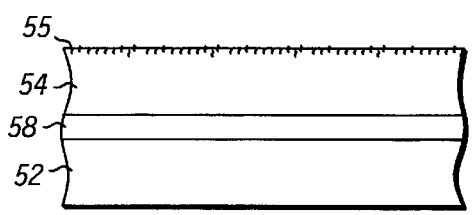
FIGS. 9–12 illustrate schematically, in cross-section, the formation of a device structure in accordance with another embodiment of the invention.

Turning now to FIG. 9, an amorphous intermediate layer 58 is grown on substrate 52 at the interface between substrate 52 and a growing accommodating buffer layer 54, which is preferably a monocrystalline crystal oxide layer, by the oxidation of substrate 52 during the growth of layer 54. Layer 54 is preferably a monocrystalline oxide material such as a monocrystalline layer of $Sr_zBa_{1-z}TiO_3$ where z ranges from 0 to 1. However, layer 54 may also comprise any of those compounds previously described with reference layer 24 in FIGS. 1–2 and any of those compounds previously described with reference to layer 36 in FIG. 3 which is formed from layers 24 and 28 referenced in FIGS. 1 and 2.

Figure 10:
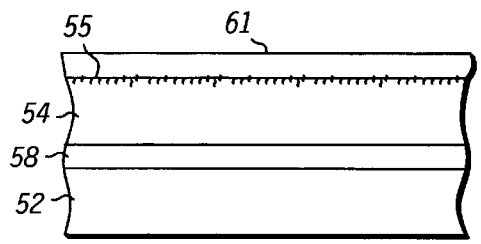
Figure 11:
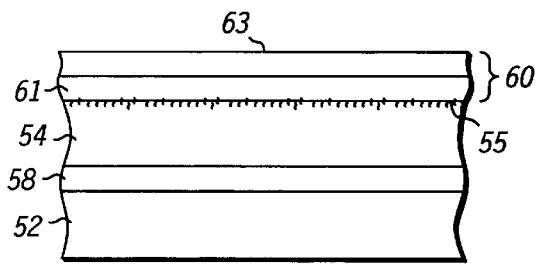

Layer 54 is grown with a strontium (Sr) terminated surface represented in FIG. 9 by hatched line 55 which is followed by the addition of a template layer 60 which includes a surfactant layer 61 and capping layer 63 as illustrated in FIGS. 10 and 11. Surfactant layer 61 may comprise, but is not limited to, elements such as Al, In and Ga, but will be dependent upon the composition of layer 54 and the overlying layer of monocrystalline material for optimal results. In one exemplary embodiment, aluminum (Al) is used for surfactant layer 61 and functions to modify the surface and surface energy of layer 54. Preferably, surfactant layer 61 is epitaxially grown, to a thickness of one to two monolayers, over layer 54 as illustrated in FIG. 10 by way of molecular beam epitaxy (MBE), although other epitaxial processes may also be performed including chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like.

Surfactant layer 61 is then exposed to a Group V element such as arsenic, for example, to form capping layer 63 as illustrated in FIG. 11. Surfactant layer 61 may be exposed to a number of materials to create capping layer 63 such as elements which include, but are not limited to, As, P, Sb and N. Surfactant layer 61 and capping layer 63 combine to form template layer 60.

Figure 12:
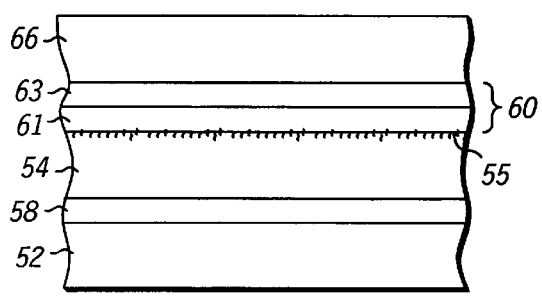

Monocrystalline material layer 66, which in this example is a compound semiconductor such as GaAs, is then deposited via MBE, CVD, MOCVD, MEE, ALE, PVD, CSD, PLD, and the like to form the final structure illustrated in FIG. 12.

FIGS. 13–16 illustrate possible molecular bond structures for a specific example of a compound semiconductor structure formed in accordance with the embodiment of the invention illustrated in FIGS. 9–12. More specifically, FIGS. 13–16 illustrate the growth of GaAs (layer 66) on the strontium terminated surface of a strontium titanate monocrystalline oxide (layer 54) using a surfactant containing template (layer 60).

The growth of a monocrystalline material layer 66 such as GaAs on an accommodating buffer layer 54 such as a strontium titanium oxide over amorphous interface layer 58 and substrate layer 52, both of which may comprise materials previously described with reference to layers 28 and 22, respectively in FIGS. 1 and 2, illustrates a critical thickness of about 1000 Angstroms where the two-dimensional (2D) and three-dimensional (3D) growth shifts because of the surface energies involved. In order to maintain a true layer by layer growth (Frank Van der Mere growth), the following relationship must be satisfied:

$$\delta_{STO} > (\delta_{INT} + \delta_{GaAs})$$

where the surface energy of the monocrystalline oxide layer 54 must be greater than the surface energy of the amorphous interface layer 58 added to the surface energy of the GaAs layer 66. Since it is impracticable to satisfy this equation, a surfactant containing template was used, as described above with reference to FIGS. 10–12, to increase the surface energy of the monocrystalline oxide layer 54 and also to shift the crystalline structure of the template to a diamond-like structure that is in compliance with the original GaAs layer.

Figure 13:
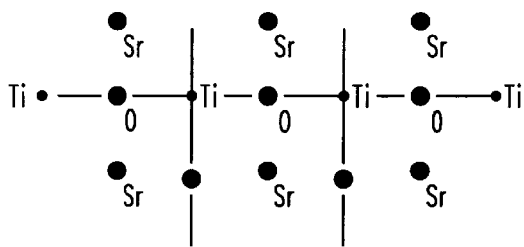
FIGS. 13–16 illustrate a probable molecular bonding structure of the device structures illustrated in FIGS. 9–12.
Figure 14:
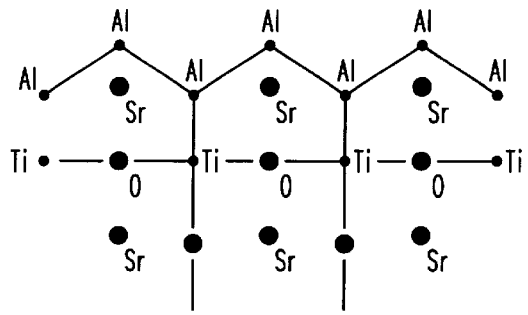
Figure 15:
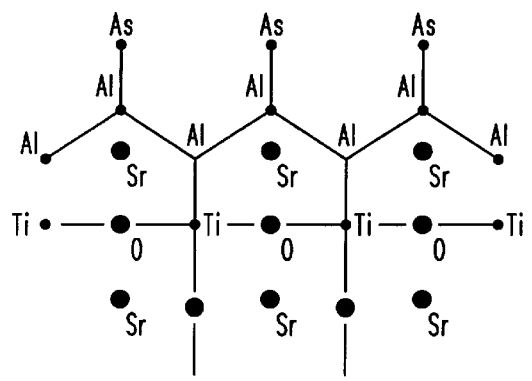
Figure 16:
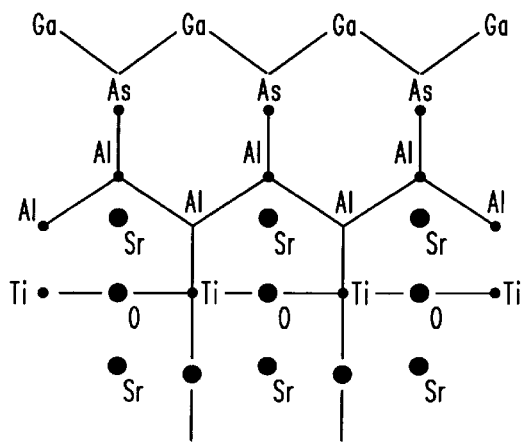

FIG. 13 illustrates the molecular bond structure of a strontium terminated surface of a strontium titanate monocrystalline oxide layer. An aluminum surfactant layer is deposited on top of the strontium terminated surface and bonds with that surface as illustrated in FIG. 14, which reacts to form a capping layer comprising a monolayer of Al$_2$Sr having the molecular bond structure illustrated in FIG. 14 which forms a diamond-like structure with an sp$^3$ hybrid terminated surface that is compliant with compound semiconductors such as GaAs. The structure is then exposed to As to form a layer of AlAs as shown in FIG. 15. GaAs is then deposited to complete the molecular bond structure illustrated in FIG. 16 which has been obtained by 2D growth. The GaAs can be grown to any thickness for forming other semiconductor structures, devices, or integrated circuits. Alkaline earth metals such as those in Group IIA are those elements preferably used to form the capping surface of the monocrystalline oxide layer 54 because they are capable of forming a desired molecular structure with aluminum.

In this embodiment, a surfactant containing template layer aids in the formation of a compliant substrate for the monolithic integration of various material layers including those comprised of Group III–V compounds to form high quality semiconductor structures, devices and integrated circuits. For example, a surfactant containing template may be used for the monolithic integration of a monocrystalline material layer such as a layer comprising Germanium (Ge), for example, to form high efficiency photocells.

Turning now to FIGS. 17–20, the formation of a device structure in accordance with still another embodiment of the invention is illustrated in cross-section. This embodiment utilizes the formation of a compliant substrate which relies on the epitaxial growth of single crystal oxides on silicon followed by the epitaxial growth of single crystal silicon onto the oxide.

Figure 17:
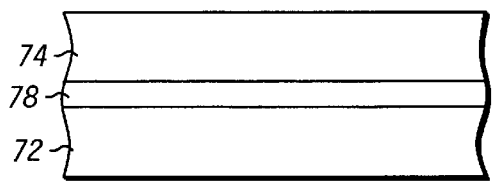
FIGS. 17–20 illustrate schematically, in cross-section, the formation of a device structure in accordance with still another embodiment of the invention.

An accommodating buffer layer 74 such as a monocrystalline oxide layer is first grown on a substrate layer 72, such as silicon, with an amorphous interface layer 78 as illustrated in FIG. 17. Monocrystalline oxide layer 74 may be comprised of any of those materials previously discussed with reference to layer 24 in FIGS. 1 and 2, while amorphous interface layer 78 is preferably comprised of any of those materials previously described with reference to the layer 28 illustrated in FIGS. 1 and 2. Substrate 72, although preferably silicon, may also comprise any of those materials previously described with reference to substrate 22 in FIGS. 1–3.

Figure 18:
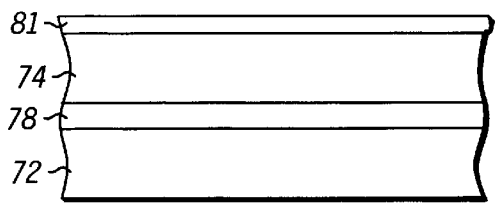

Next, a silicon layer 81 is deposited over monocrystalline oxide layer 74 via MBE, CVD, MOCVD, MEE, ALE, PVD, CSD, PLD, and the like as illustrated in FIG. 18 with a thickness of a few hundred Angstroms but preferably with a thickness of about 50 Angstroms. Monocrystalline oxide layer 74 preferably has a thickness of about 20 to 100 Angstroms.

Figure 19:
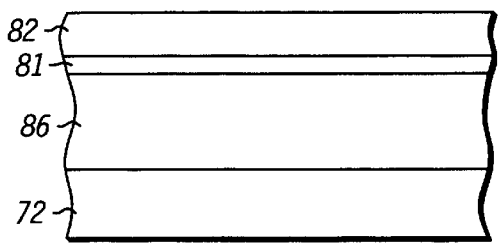

Rapid thermal annealing is then conducted in the presence of a carbon source such as acetylene or methane, for example at a temperature within a range of about 800° C. to 1000° C. to form capping layer 82 and silicate amorphous layer 86. However, other suitable carbon sources may be used as long as the rapid thermal annealing step functions to amorphize the monocrystalline oxide layer 74 into a silicate amorphous layer 86 and carbonize the top silicon layer 81 to form capping layer 82 which in this example would be a silicon carbide (SiC) layer as illustrated in FIG. 19. The formation of amorphous layer 86 is similar to the formation of layer 36 illustrated in FIG. 3 and may comprise any of those materials described with reference to layer 36 in FIG. 3 but the preferable material will be dependent upon the capping layer 82 used for silicon layer 81.

Finally, a compound semiconductor layer 96, such as gallium nitride (GaN) is grown over the SiC surface by way of MBE, CVD, MOCVD, MEE, ALE, PVD, CSD, PLD, or the like to form a high quality compound semiconductor material for device formation. More specifically, the deposition of GaN and GaN based systems such as GaInN and AlGaN will result in the formation of dislocation nets confined at the silicon/amorphous region. The resulting nitride containing compound semiconductor material may comprise elements from groups III, IV and V of the periodic table and is defect free.

Although GaN has been grown on SiC substrate in the past, this embodiment of the invention possesses a one step formation of the compliant substrate containing a SiC top surface and an amorphous layer on a Si surface. More specifically, this embodiment of the invention uses an intermediate single crystal oxide layer that is amorphosized to form a silicate layer which adsorbs the strain between the layers. Moreover, unlike past use of a SiC substrate, this embodiment of the invention is not limited by wafer size which is usually less than 50 mm in diameter for prior art SiC substrates.

The monolithic integration of nitride containing semiconductor compounds containing group III–V nitrides and silicon devices can be used for high temperature RF applications and optoelectronics. GaN systems have particular use in the photonic industry for the blue/green and UV light sources and detection. High brightness light emitting diodes (LEDs) and lasers may also be formed within the GaN system.

Figure 21:
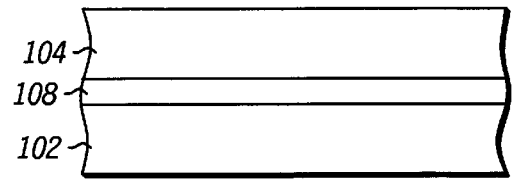
FIGS. 21–23 illustrate schematically, in cross section, the formation of a yet another embodiment of a device structure in accordance with the invention.
Figure 22:
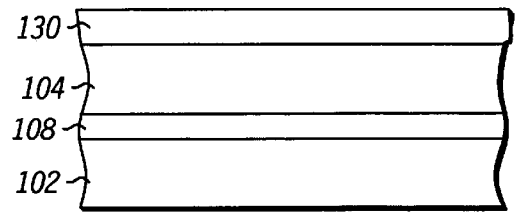
Figure 23:
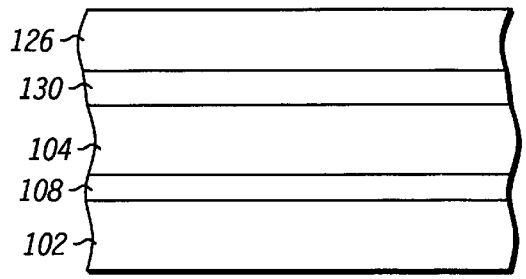
Figure 20:
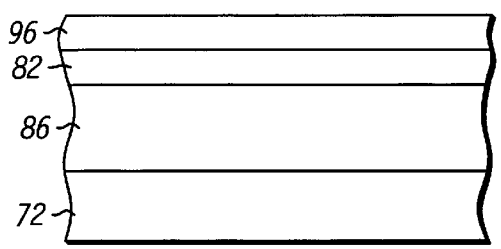

FIGS. 21–23 schematically illustrate, in cross-section, the formation of another embodiment of a device structure in accordance with the invention. This embodiment includes a compliant layer that functions as a transition layer that uses clathrate or Zintl type bonding. More specifically, this embodiment utilizes an intermetallic template layer to reduce the surface energy of the interface between material layers thereby allowing for two dimensional layer by layer growth.

The structure illustrated in FIG. 21 includes a monocrystalline substrate 102, an amorphous interface layer 108 and an accommodating buffer layer 104. Amorphous interface layer 108 is formed on substrate 102 at the interface between substrate 102 and accommodating buffer layer 104 as previously described with reference to FIGS. 1 and 2. Amorphous interface layer 108 may comprise any of those materials previously described with reference to amorphous interface layer 28 in FIGS. 1 and 2. Substrate 102 is preferably silicon but may also comprise any of those materials previously described with reference to substrate 22 in FIGS. 1–3.

A template layer 130 is deposited over accommodating buffer layer 104 as illustrated in FIG. 22 and preferably comprises a thin layer of Zintl type phase material composed of metals and metalloids having a great deal of ionic character. As in previously described embodiments, template layer 130 is deposited by way of MBE, CVD, MOCVD, MEE, ALE, PVD, CSD, PLD, or the like to achieve a thickness of one monolayer. Template layer 130 functions as a "soft" layer with non-directional bonding but high crystallinity which absorbs stress build up between layers having lattice mismatch. Materials for template 130 may include, but are not limited to, materials containing Si, Ga, In, and Sb such as, for example, $AlSr_2$, $(MgCaYb)Ga_2$, $(Ca,Sr,Eu,Yb)In_2$, $BaGe_2As$, and $SrSn_2As_2$ A monocrystalline material layer 126 is epitaxially grown over template layer 130 to achieve the final structure illustrated in FIG. 23. As a specific example, an $SrAl_2$ layer may be used as template layer 130 and an appropriate monocrystalline material layer 126 such as a compound semiconductor material GaAs is grown over the $SrAl_2$. The Al—Ti (from the accommodating buffer layer of layer of $Sr_zBa_{1-z}TiO_3$ where z ranges from 0 to 1) bond is mostly metallic while the Al—As (from the GaAs layer) bond is weakly covalent. The Sr participates in two distinct types of bonding with part of its electric charge going to the oxygen atoms in the lower accommodating buffer layer 104 comprising $Sr_zBa_{1-z}TiO_3$ to participate in ionic bonding and the other part of its valence charge being donated to Al in a way that is typically carried out with Zintl phase materials. The amount of the charge transfer depends on the relative electronegativity of elements comprising the template layer 130 as well as on the interatomic distance. In this example, Al assumes an $sp^3$ hybridization and can readily form bonds with monocrystalline material layer 126, which in this example, comprises compound semiconductor material GaAs.

The compliant substrate produced by use of the Zintl type template layer used in this embodiment can absorb a large strain without a significant energy cost. In the above example, the bond strength of the Al is adjusted by changing the volume of the $SrAl_2$ layer thereby making the device tunable for specific applications which include the monolithic integration of III–V and Si devices and the monolithic integration of high-k dielectric materials for CMOS technology.

Clearly, those embodiments specifically describing structures having compound semiconductor portions and Group IV semiconductor portions, are meant to illustrate embodiments of the present invention and not limit the present invention. There are a multiplicity of other combinations and other embodiments of the present invention. For example, the present invention includes structures and methods for fabricating material layers which form semiconductor structures, devices and integrated circuits including other layers such as metal and non-metal layers. More specifically, the invention includes structures and methods for forming a compliant substrate which is used in the fabrication of semiconductor structures, devices and integrated circuits and the material layers suitable for fabricating those structures, devices, and integrated circuits. By using embodiments of the present invention, it is now simpler to integrate devices that include monocrystalline layers comprising semiconductor and compound semiconductor materials as well as other material layers that are used to form those devices with other components that work better or are easily and/or inexpensively formed within semiconductor or compound semiconductor materials. This allows a device to be shrunk, the manufacturing costs to decrease, and yield and reliability to increase.

In accordance with one embodiment of this invention, a monocrystalline semiconductor or compound semiconductor wafer can be used in forming monocrystalline material layers over the wafer. In this manner, the wafer is essentially a "handle" wafer used during the fabrication of semiconductor electrical components within a monocrystalline layer overlying the wafer. Therefore, electrical components can be formed within semiconductor materials over a wafer of at least approximately 200 millimeters in diameter and possibly at least approximately 300 millimeters.

By the use of this type of substrate, a relatively inexpensive "handle" wafer overcomes the fragile nature of compound semiconductor or other monocrystalline material wafers by placing them over a relatively more durable and easy to fabricate base material. Therefore, an integrated circuit can be formed such that all electrical components, and particularly all active electronic devices, can be formed within or using the monocrystalline material layer even though the substrate itself may include a monocrystalline semiconductor material. Fabrication costs for compound semiconductor devices and other devices employing non-silicon monocrystalline materials should decrease because larger substrates can be processed more economically and more readily compared to the relatively smaller and more fragile substrates (e.g. conventional compound semiconductor wafers).

Figure 24:
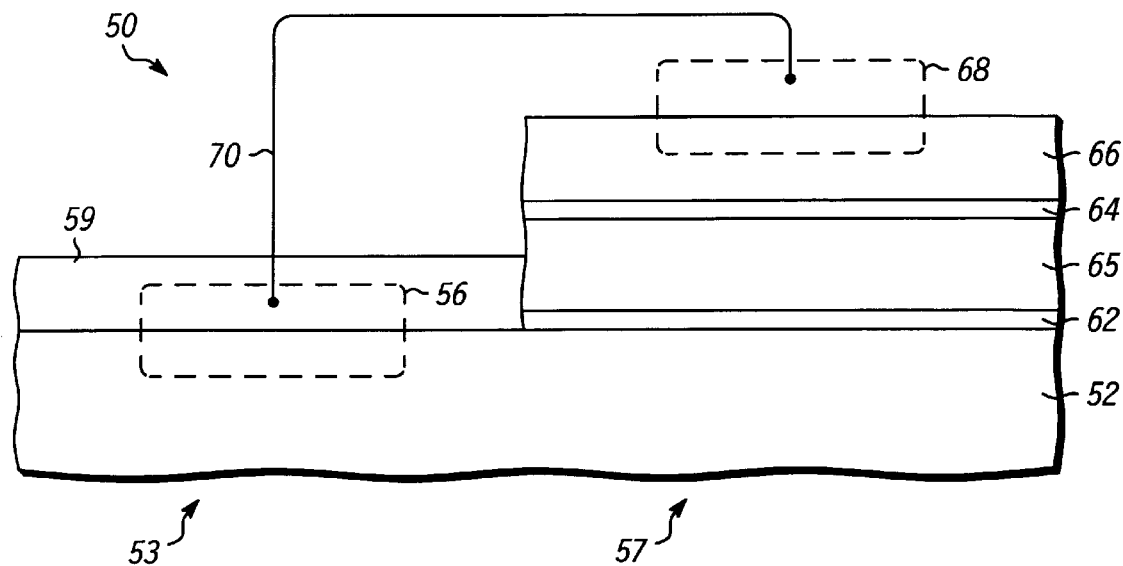
FIGS. 24, 25 illustrate schematically, in cross section, device structures that can be used in accordance with various embodiments of the invention.

FIG. 24 illustrates schematically, in cross section, a device structure 50 in accordance with a further embodiment. Device structure 50 includes a monocrystalline semiconductor substrate 52, preferably a monocrystalline silicon wafer. Monocrystalline semiconductor substrate 52 includes two regions, 53 and 57. An electrical semiconductor component generally indicated by the dashed line 56 is formed, at least partially, in region 53. Electrical component 56 can be a resistor, a capacitor, an active semiconductor component such as a diode or a transistor or an integrated circuit such as a CMOS integrated circuit. For example, electrical semiconductor component 56 can be a CMOS integrated circuit configured to perform digital signal processing or another function for which silicon integrated circuits are well suited. The electrical semiconductor component in region 53 can be formed by conventional semiconductor processing as well known and widely practiced in the semiconductor industry. A layer of insulating material 59 such as a layer of silicon dioxide or the like may overlie electrical semiconductor component 56.

Insulating material 59 and any other layers that may have been formed or deposited during the processing of semiconductor component 56 in region 53 are removed from the surface of region 57 to provide a bare silicon surface in that region. As is well known, bare silicon surfaces are highly reactive and a native silicon oxide layer can quickly form on the bare surface. A layer of barium or barium and oxygen is deposited onto the native oxide layer on the surface of region 57 and is reacted with the oxidized surface to form a first template layer (not shown). In accordance with one embodiment, a monocrystalline oxide layer is formed overlying the template layer by a process of molecular beam epitaxy. Reactants including barium, titanium and oxygen are deposited onto the template layer to form the monocrystalline oxide layer. Initially during the deposition the partial pressure of oxygen is kept near the minimum necessary to fully react with the barium and titanium to form monocrystalline barium titanate layer. The partial pressure of oxygen is then increased to provide an overpressure of oxygen and to allow oxygen to diffuse through the growing monocrystalline oxide layer. The oxygen diffusing through the barium titanate reacts with silicon at the surface of region 57 to form an amorphous layer of silicon oxide 62 on second region 57 and at the interface between silicon substrate 52 and the monocrystalline oxide layer 65. Layers 65 and 62 may be subject to an annealing process as described above in connection with FIG. 3 to form a single amorphous accommodating layer.

In accordance with an embodiment, the step of depositing the monocrystalline oxide layer 65 is terminated by depositing a second template layer 64, which can be 1–10 monolayers of titanium, barium, barium and oxygen, or titanium and oxygen. A layer 66 of a monocrystalline compound semiconductor material is then deposited overlying second template layer 64 by a process of molecular beam epitaxy. The deposition of layer 66 is initiated by depositing a layer of arsenic onto template 64. This initial step is followed by depositing gallium and arsenic to form monocrystalline gallium arsenide 66. Alternatively, strontium can be substituted for barium in the above example.

In accordance with a further embodiment, a semiconductor component, generally indicated by a dashed line 68 is formed in compound semiconductor layer 66. Semiconductor component 68 can be formed by processing steps conventionally used in the fabrication of gallium arsenide or other III–V compound semiconductor material devices. Semiconductor component 68 can be any active or passive component, and preferably is a semiconductor laser, light emitting diode, photodetector, heterojunction bipolar transistor (HBT), high frequency MESFET, or other component that utilizes and takes advantage of the physical properties of compound semiconductor materials. A metallic conductor schematically indicated by the line 70 can be formed to electrically couple device 68 and device 56, thus implementing an integrated device that includes at least one component formed in silicon substrate 52 and one device formed in monocrystalline compound semiconductor material layer 66. Although illustrative structure 50 has been described as a structure formed on a silicon substrate 52 and having a barium (or strontium) titanate layer 65 and a gallium arsenide layer 66, similar devices can be fabricated using other substrates, monocrystalline oxide layers and other compound semiconductor layers as described elsewhere in this disclosure.

Figure 25:
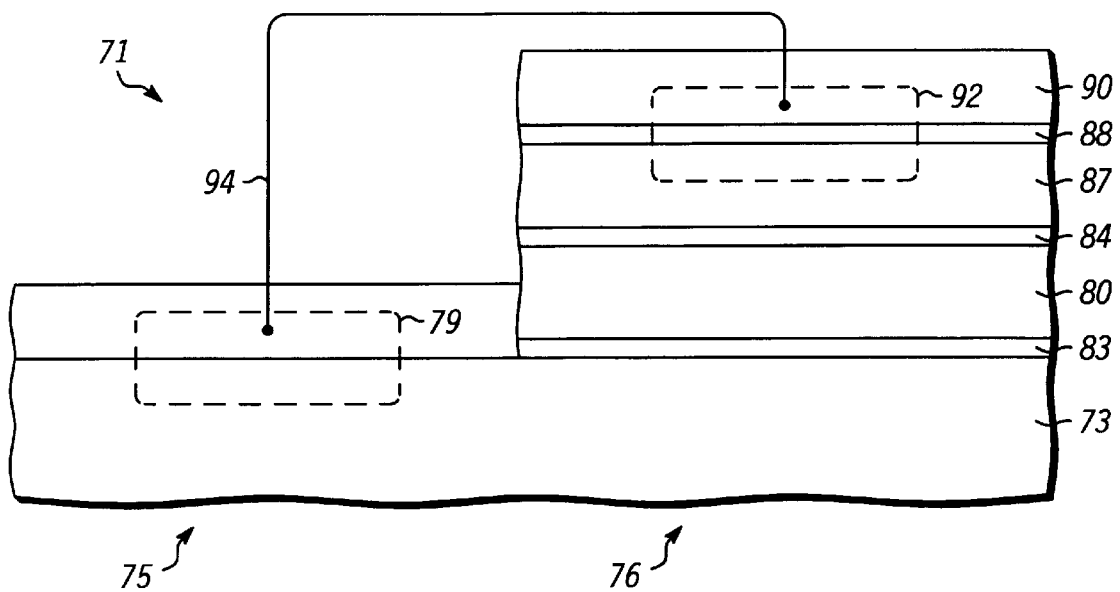

FIG. 25 illustrates a semiconductor structure 71 in accordance with a further embodiment. Structure 71 includes a monocrystalline semiconductor substrate 73 such as a monocrystalline silicon wafer that includes a region 75 and a region 76. An electrical component schematically illustrated by the dashed line 79 is formed in region 75 using conventional silicon device processing techniques commonly used in the semiconductor industry. Using process steps similar to those described above, a monocrystalline oxide layer 80 and an intermediate amorphous silicon oxide layer 83 are formed overlying region 76 of substrate 73. A template layer 84 and subsequently a monocrystalline semiconductor layer 87 are formed overlying monocrystalline oxide layer 80. In accordance with a further embodiment, an additional monocrystalline oxide layer 88 is formed overlying layer 87 by process steps similar to those used to form layer 80, and an additional monocrystalline semiconductor layer 90 is formed overlying monocrystalline oxide layer 88 by process steps similar to those used to form layer 87. In accordance with one embodiment, at least one of layers 87 and 90 are formed from a compound semiconductor material. Layers 80 and 83 may be subject to an annealing process as described above in connection with FIG. 3 to form a single amorphous accommodating layer.

A semiconductor component generally indicated by a dashed line 92 is formed at least partially in monocrystalline semiconductor layer 87. In accordance with one embodiment, semiconductor component 92 may include a field effect transistor having a gate dielectric formed, in part, by monocrystalline oxide layer 88. In addition, monocrystalline semiconductor layer 90 can be used to implement the gate electrode of that field effect transistor. In accordance with one embodiment, monocrystalline semiconductor layer 87 is formed from a group III–V compound and semiconductor component 92 is a radio frequency amplifier that takes advantage of the high mobility characteristic of group III–V component materials. In accordance with yet a further embodiment, an electrical interconnection schematically illustrated by the line 94 electrically interconnects component 79 and component 92. Structure 71 thus integrates components that take advantage of the unique properties of the two monocrystalline semiconductor materials.

Figure 26:
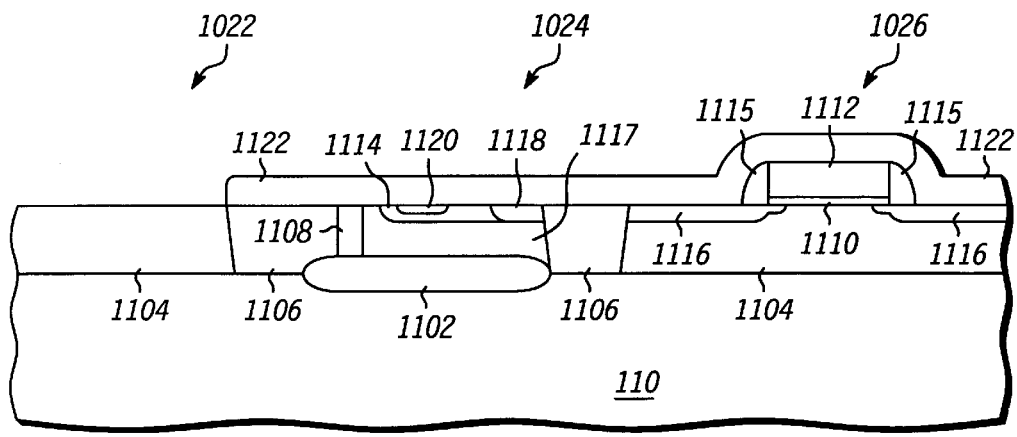
FIGS. 26–30 include illustrations of cross-sectional views of a portion of an integrated circuit that includes a compound semiconductor portion, a bipolar portion, and an MOS portion in accordance with what is shown herein.

Attention is now directed to a method for forming exemplary portions of illustrative composite semiconductor structures or composite integrated circuits like 50 or 71. In particular, the illustrative composite semiconductor structure or integrated circuit 103 shown in FIGS. 26–30 includes a compound semiconductor portion 1022, a bipolar portion 1024, and a MOS portion 1026. In FIG. 26, a p-type doped, monocrystalline silicon substrate 110 is provided having a compound semiconductor portion 1022, a bipolar portion 1024, and an MOS portion 1026. Within bipolar portion 1024, the monocrystalline silicon substrate 110 is doped to form an N$^+$buried region 1102. A lightly p-type doped epitaxial monocrystalline silicon layer 1104 is then formed over the buried region 1102 and the substrate 110. A doping step is then performed to create a lightly n-type doped drift region 1117 above the N$^+$buried region 1102. The doping step converts the dopant type of the lightly p-type epitaxial layer within a section of the bipolar region 1024 to a lightly n-type monocrystalline silicon region. A field isolation region 1106 is then formed between and around the bipolar portion 1024 and the MOS portion 1026. A gate dielectric layer 1110 is formed over a portion of the epitaxial layer 1104 within MOS portion 1026, and the gate electrode 1112 is then formed over the gate dielectric layer 1110. Sidewall spacers 1115 are formed along vertical sides of the gate electrode 1112 and gate dielectric layer 1110.

A p-type dopant is introduced into the drift region 1117 to form an active or intrinsic base region 1114. An n-type, deep collector region 1108 is then formed within the bipolar portion 1024 to allow electrical connection to the buried region 1102. Selective n-type doping is performed to form N$^+$doped regions 1116 and the emitter region 1120. N$^+$doped regions 1116 are formed within layer 1104 along adjacent sides of the gate electrode 1112 and are source, drain, or source/drain regions for the MOS transistor. The N$^+$doped regions 1116 and emitter region 1120 have a doping concentration of at least 1E19 atoms per cubic centimeter to allow ohmic contacts to be formed. A p-type doped region is formed to create the inactive or extrinsic base region 1118 which is a P$^+$doped region (doping concentration of at least 1E19 atoms per cubic centimeter).

In the embodiment described, several processing steps have been performed but are not illustrated or further described, such as the formation of well regions, threshold adjusting implants, channel punchthrough prevention implants, field punchthrough prevention implants, as well as a variety of masking layers. The formation of the device up to this point in the process is performed using conventional steps. As illustrated, a standard N-channel MOS transistor has been formed within the MOS region 1026, and a vertical NPN bipolar transistor has been formed within the bipolar portion 1024. Although illustrated with a NPN bipolar transistor and a N-channel MOS transistor, device structures and circuits in accordance with various embodiments may additionally or alternatively include other electronic devices formed using the silicon substrate. As of this point, no circuitry has been formed within the compound semiconductor portion 1022.

After the silicon devices are formed in regions 1024 and 1026, a protective layer 1122 is formed overlying devices in regions 1024 and 1026 to protect devices in regions 1024 and 1026 from potential damage resulting from device formation in region 1022. Layer 1122 may be formed of, for example, an insulating material such as silicon oxide or silicon nitride.

All of the layers that have been formed during the processing of the bipolar and MOS portions of the integrated circuit, except for epitaxial layer 1104 but including protective layer 1122, are now removed from the surface of compound semiconductor portion 1022. A bare silicon surface is thus provided for the subsequent processing of this portion, for example in the manner set forth above.

Figure 27:
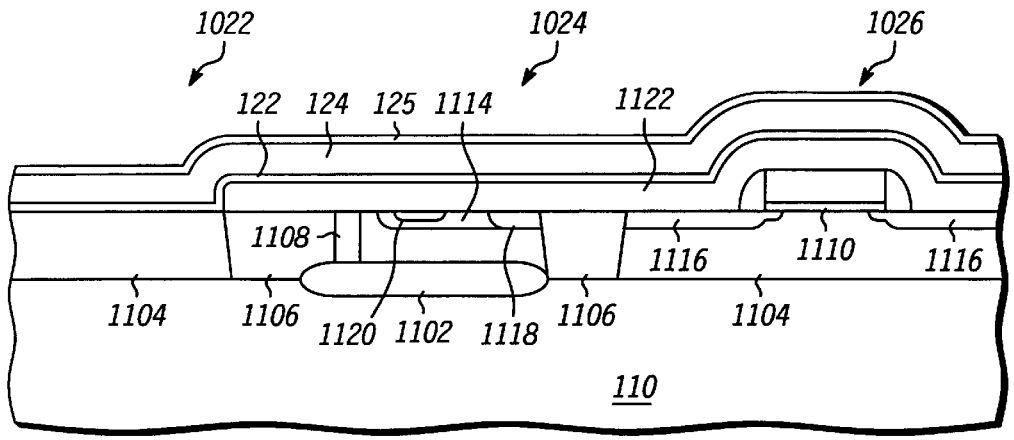

An accommodating buffer layer 124 is then formed over the substrate 110 as illustrated in FIG. 27. The accommodating buffer layer will form as a monocrystalline layer over the properly prepared (i.e., having the appropriate template layer) bare silicon surface in portion 1022. The portion of layer 124 that forms over portions 1024 and 1026, however, may be polycrystalline or amorphous because it is formed over a material that is not monocrystalline, and therefore, does not nucleate monocrystalline growth. The accommodating buffer layer 124 typically is a monocrystalline metal oxide or nitride layer and typically has a thickness in a range of approximately 2–100 nanometers. In one particular embodiment, the accommodating buffer layer is approximately 5–15 nm thick. During the formation of the accommodating buffer layer, an amorphous intermediate layer 122 is formed along the uppermost silicon surfaces of the integrated circuit 103. This amorphous intermediate layer 122 typically includes an oxide of silicon and has a thickness and range of approximately 1–5 nm. In one particular embodiment, the thickness is approximately 2 nm. Following the formation of the accommodating buffer layer 124 and the amorphous intermediate layer 122, a template layer 125 is then formed and has a thickness in a range of approximately one to ten monolayers of a material. In one particular embodiment, the material includes titanium-arsenic, strontium-oxygen-arsenic, or other similar materials as previously described with respect to FIGS. 1–5.

Figure 28:
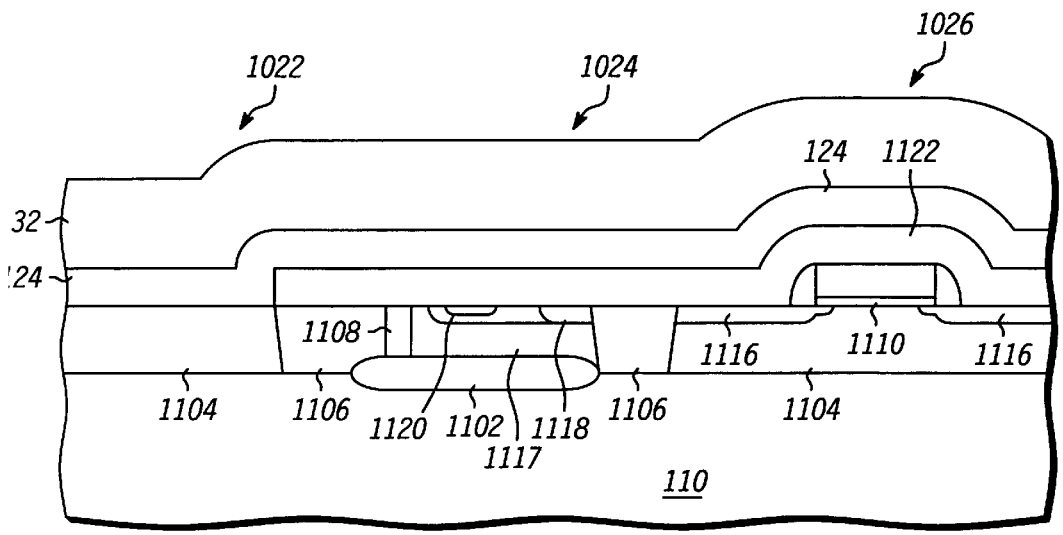

A monocrystalline compound semiconductor layer 132 is then epitaxially grown overlying the monocrystalline portion of accommodating buffer layer 124 as shown in FIG. 28. The portion of layer 132 that is grown over portions of layer 124 that are not monocrystalline may be polycrystalline or amorphous. The compound semiconductor layer can be formed by a number of methods and typically includes a material such as gallium arsenide, aluminum gallium arsenide, indium phosphide, or other compound semiconductor materials as previously mentioned. The thickness of the layer is in a range of approximately 1–5,000 nm, and more preferably 100–2000 nm. Furthermore, additional monocrystalline layers may be formed above layer 132, as discussed in more detail below in connection with FIGS. 31–32.

In this particular embodiment, each of the elements within the template layer are also present in the accommodating buffer layer 124, the monocrystalline compound semiconductor material 132, or both. Therefore, the delineation between the template layer 125 and its two immediately adjacent layers disappears during processing. Therefore, when a transmission electron microscopy (TEM) photograph is taken, an interface between the accommodating buffer layer 124 and the monocrystalline compound semiconductor layer 132 is seen.

After at least a portion of layer 132 is formed in region 1022, layers 122 and 124 may be subject to an annealing process as described above in connection with FIG. 3 to form a single amorphous accommodating layer. If only a portion of layer 132 is formed prior to the anneal process, the remaining portion may be deposited onto structure 103 prior to further processing.

Figure 29:
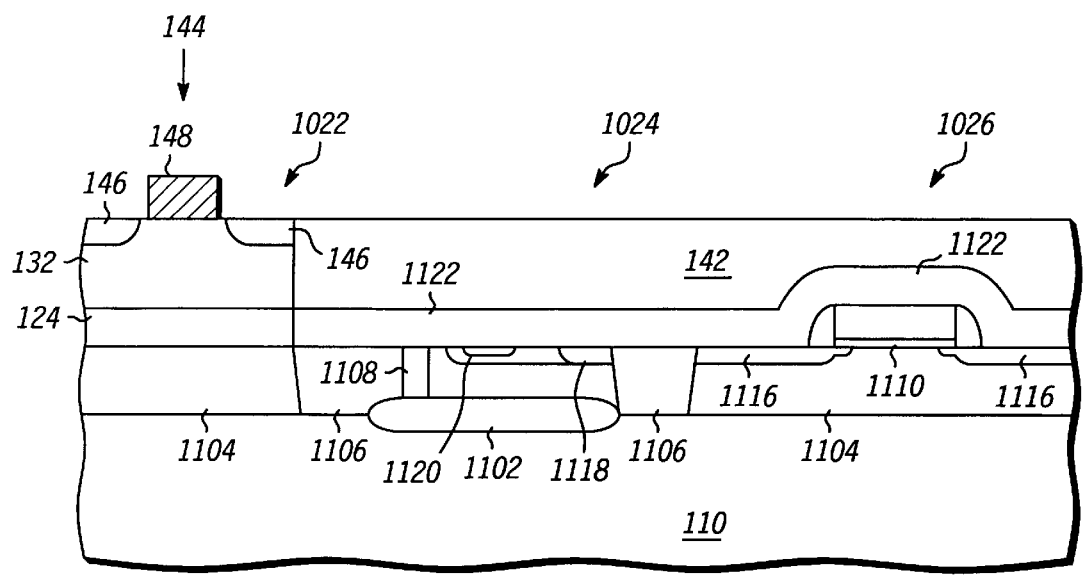

At this point in time, sections of the compound semiconductor layer 132 and the accommodating buffer layer 124 (or of the amorphous accommodating layer if the annealing process described above has been carried out) are removed from portions overlying the bipolar portion 1024 and the MOS portion 1026 as shown in FIG. 29. After the section of the compound semiconductor layer and the accommodating buffer layer 124 are removed, an insulating layer 142 is formed over protective layer 1122. The insulating layer 142 can include a number of materials such as oxides, nitrides, oxynitrides, low-k dielectrics, or the like. As used herein, low-k is a material having a dielectric constant no higher than approximately 3.5. After the insulating layer 142 has been deposited, it is then polished or etched to remove portions of the insulating layer 142 that overlie monocrystalline compound semiconductor layer 132.

A transistor 144 is then formed within the monocrystalline compound semiconductor portion 1022. A gate electrode 148 is then formed on the monocrystalline compound semiconductor layer 132. Doped regions 146 are then formed within the monocrystalline compound semiconductor layer 132. In this embodiment, the transistor 144 is a metal-semiconductor field-effect transistor (MESFET). If the MESFET is an n-type MESFET, the doped regions 146 and at least a portion of monocrystalline compound semiconductor layer 132 are also n-type doped. If a p-type MESFET were to be formed, then the doped regions 146 and at least a portion of monocrystalline compound semiconductor layer 132 would have just the opposite doping type. The heavier doped (N$^+$) regions 146 allow ohmic contacts to be made to the monocrystalline compound semiconductor layer 132. At this point in time, the active devices within the integrated circuit have been formed. Although not illustrated in the drawing figures, additional processing steps such as formation of well regions, threshold adjusting implants, channel punchthrough prevention implants, field punchthrough prevention implants, and the like may be performed in accordance with the present invention. This particular embodiment includes an n-type MESFET, a vertical NPN bipolar transistor, and a planar n-channel MOS transistor. Many other types of transistors, including P-channel MOS transistors, p-type vertical bipolar transistors, p-type MESFETs, and combinations of vertical and planar transistors, can be used. Also, other electrical components, such as resistors, capacitors, diodes, and the like, may be formed in one or more of the portions 1022, 1024, and 1026.

Figure 30:
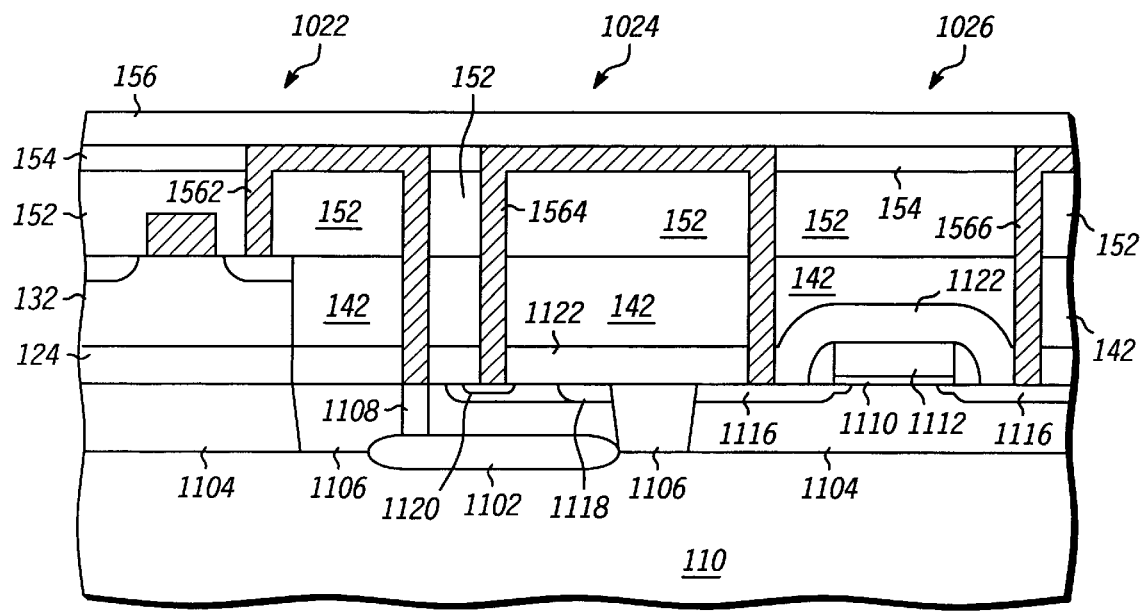

Processing continues to form a substantially completed integrated circuit 103 as illustrated in FIG. 30. An insulating layer 152 is formed over the substrate 110. The insulating layer 152 may include an etch-stop or polish-stop region that is not illustrated in FIG. 30. A second insulating layer 154 is then formed over the first insulating layer 152. Portions of layers 154, 152, 142, 124, and 1122 are removed to define contact openings where the devices are to be interconnected. Interconnect trenches are formed within insulating layer 154 to provide the lateral connections between the contacts. As illustrated in FIG. 30, interconnect 1562 connects a source or drain region of the n-type MESFET within portion 1022 to the deep collector region 1108 of the NPN transistor within the bipolar portion 1024. The emitter region 1120 of the NPN transistor is connected to one of the doped regions 1116 of the n-channel MOS transistor within the MOS portion 1026. The other doped region 1116 is electrically connected to other portions of the integrated circuit that are not shown. Similar electrical connections are also formed to couple regions 1118 and 1112 to other regions of the integrated circuit.

A passivation layer 156 is formed over the interconnects 1562, 1564, and 1566 and insulating layer 154. Other electrical connections are made to the transistors as illustrated as well as to other electrical or electronic components within the integrated circuit 103 but are not illustrated in the FIGS. Further, additional insulating layers and interconnects may be formed as necessary to form the proper interconnections between the various components within the integrated circuit 103.

As can be seen from the previous embodiment, active devices for both compound semiconductor and Group IV semiconductor materials can be integrated into a single integrated circuit. Because there is some difficulty in incorporating both bipolar transistors and MOS transistors within a same integrated circuit, it may be possible to move some of the components within bipolar portion 1024 into the compound semiconductor portion 1022 or the MOS portion 1026. Therefore, the requirement of special fabricating steps solely used for making a bipolar transistor can be eliminated. Therefore, there would only be a compound semiconductor portion and a MOS portion to the integrated circuit.

In still another embodiment, an integrated circuit can be formed such that it includes an optical laser in a compound semiconductor portion and an optical interconnect (waveguide) to a MOS transistor within a Group IV semiconductor region of the same integrated circuit. FIGS. 31–37 include illustrations of one embodiment.

Figure 31:
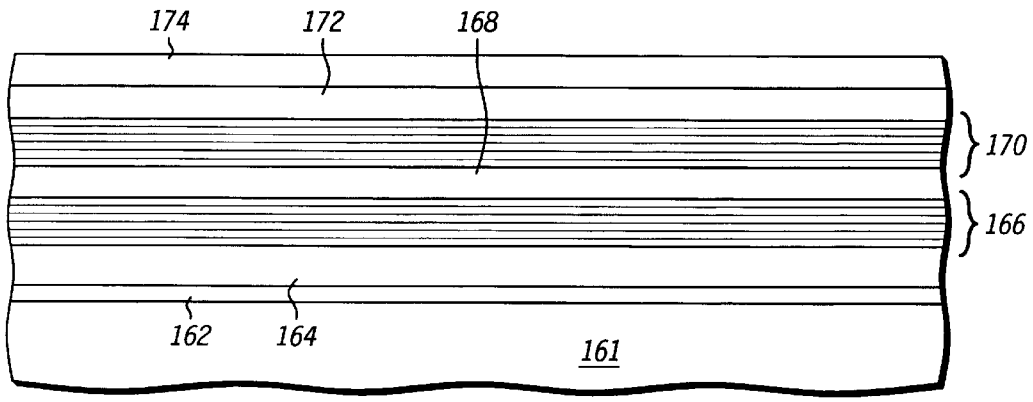
FIGS. 31–37 include illustrations of cross-sectional views of a portion of another integrated circuit that includes a semiconductor laser and a MOS transistor in accordance with what is shown herein.

FIG. 31 includes an illustration of a cross-section view of a portion of an integrated circuit 160 that includes a monocrystalline silicon wafer 161. An amorphous intermediate layer 162 and an accommodating buffer layer 164, similar to those previously described, have been formed over wafer 161. Layers 162 and 164 may be subject to an annealing process as described above in connection with FIG. 3 to form a single amorphous accommodating layer. In this specific embodiment, the layers needed to form the optical laser will be formed first, followed by the layers needed for the MOS transistor. In FIG. 31, the lower mirror layer 166 includes alternating layers of compound semiconductor materials. For example, the first, third, and fifth films within the optical laser may include a material such as gallium arsenide, and the second, fourth, and sixth films within the lower mirror layer 166 may include aluminum gallium arsenide or vice versa. Layer 168 includes the active region that will be used for photon generation. Upper mirror layer 170 is formed in a similar manner to the lower mirror layer 166 and includes alternating films of compound semiconductor materials. In one particular embodiment, the upper mirror layer 170 may be p-type doped compound semiconductor materials, and the lower mirror layer 166 may be n-type doped compound semiconductor materials.

Another accommodating buffer layer 172, similar to the accommodating buffer layer 164, is formed over the upper mirror layer 170. In an alternative embodiment, the accommodating buffer layers 164 and 172 may include different materials. However, their function is essentially the same in that each is used for making a transition between a compound semiconductor layer and a monocrystalline Group IV semiconductor layer. Layer 172 may be subject to an annealing process as described above in connection with FIG. 3 to form an amorphous accommodating layer. A monocrystalline Group IV semiconductor layer 174 is formed over the accommodating buffer layer 172. In one particular embodiment, the monocrystalline Group IV semiconductor layer 174 includes germanium, silicon germanium, silicon germanium carbide, or the like.

Figure 32:
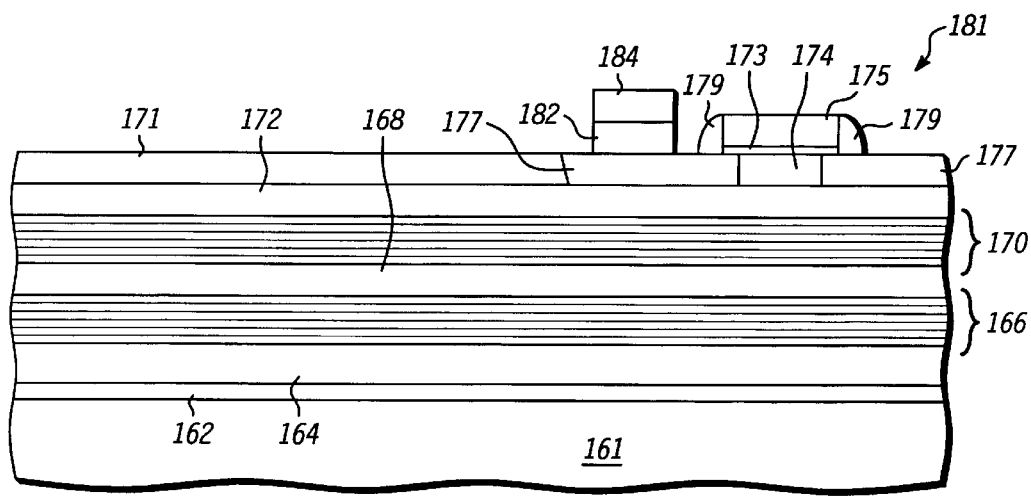

In FIG. 32, the MOS portion is processed to form electrical components within this upper monocrystalline Group IV semiconductor layer 174. As illustrated in FIG. 32, a field isolation region 171 is formed from a portion of layer 174. A gate dielectric layer 173 is formed over the layer 174, and a gate electrode 175 is formed over the gate dielectric layer 173. Doped regions 177 are source, drain, or source/drain regions for the transistor 181, as shown. Sidewall spacers 179 are formed adjacent to the vertical sides of the gate electrode 175. Other components can be made within at least a part of layer 174. These other components include other transistors (n-channel or p-channel), capacitors, transistors, diodes, and the like.

A monocrystalline Group IV semiconductor layer is epitaxially grown over one of the doped regions 177. An upper portion 184 is P+ doped, and a lower portion 182 remains substantially intrinsic (undoped) as illustrated in FIG. 32. The layer can be formed using a selective epitaxial process. In one embodiment, an insulating layer (not shown) is formed over the transistor 181 and the field isolation region 171. The insulating layer is patterned to define an opening that exposes one of the doped regions 177. At least initially, the selective epitaxial layer is formed without dopants. The entire selective epitaxial layer may be intrinsic, or a p-type dopant can be added near the end of the formation of the selective epitaxial layer. If the selective epitaxial layer is intrinsic, as formed, a doping step may be formed by implantation or by furnace doping. Regardless how the P+ upper portion 184 is formed, the insulating layer is then removed to form the resulting structure shown in FIG. 32.

Figure 33:
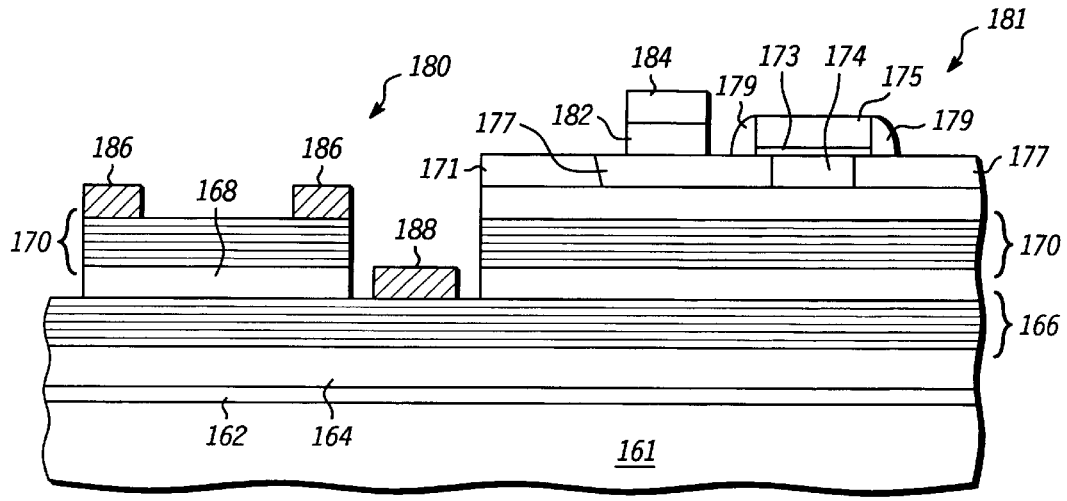

The next set of steps is performed to define the optical laser 180 as illustrated in FIG. 33. The field isolation region 171 and the accommodating buffer layer 172 are removed over the compound semiconductor portion of the integrated circuit. Additional steps are performed to define the upper mirror layer 170 and active layer 168 of the optical laser 180. The sides of the upper mirror layer 170 and active layer 168 are substantially coterminous.

Contacts 186 and 188 are formed for making electrical contact to the upper mirror layer 170 and the lower mirror layer 166, respectively, as shown in FIG. 33. Contact 186 has an annular shape to allow light (photons) to pass out of the upper mirror layer 170 into a subsequently formed optical waveguide.

Figure 34:
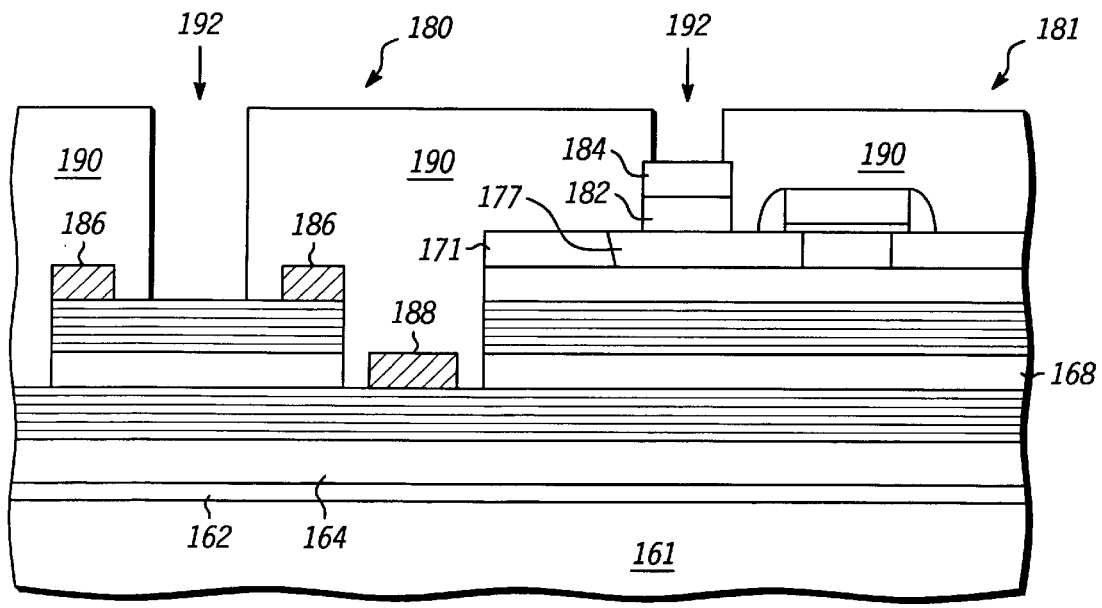
Figure 35:
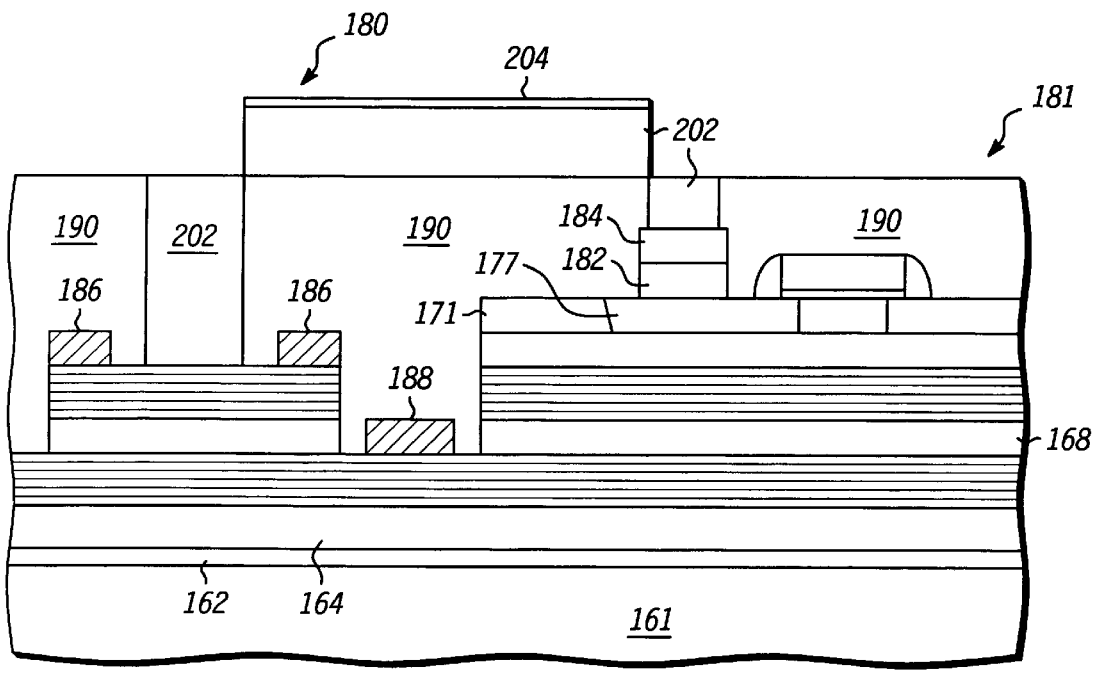

An insulating layer 190 is then formed and patterned to define optical openings extending to the contact layer 186 and one of the doped regions 177 as shown in FIG. 34. The insulating material can be any number of different materials, including an oxide, nitride, oxynitride, low-k dielectric, or any combination thereof. After defining the openings 192, a higher refractive index material 202 is then formed within the openings to fill them and to deposit the layer over the insulating layer 190 as illustrated in FIG. 35. With respect to the higher refractive index material 202, "higher" is in relation to the material of the insulating layer 190 (i.e., material 202 has a higher refractive index compared to the insulating layer 190). Optionally, a relatively thin lower refractive index film (not shown) could be formed before forming the higher refractive index material 202. A hard mask layer 204 is then formed over the high refractive index layer 202. Portions of the hard mask layer 204, and high refractive index layer 202 are removed from portions overlying the opening and to areas closer to the sides of FIG. 35.

Figure 36:
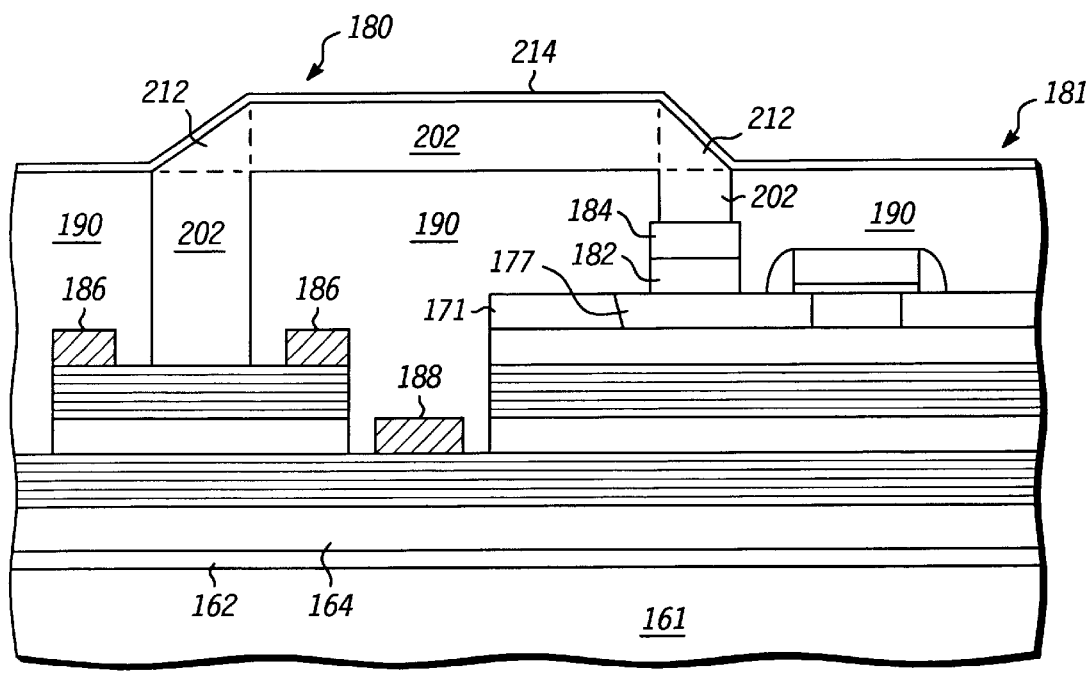

The balance of the formation of the optical waveguide, which is an optical interconnect, is completed as illustrated in FIG. 36. A deposition procedure (possibly a dep-etch process) is performed to effectively create sidewalls sections 212. In this embodiment, the sidewall sections 212 are made of the same material as material 202. The hard mask layer 204 is then removed, and a low refractive index layer 214 (low relative to material 202 and layer 212) is formed over the higher refractive index material 212 and 202 and exposed portions of the insulating layer 190. The dash lines in FIG. 36 illustrate the border between the high refractive index materials 202 and 212. This designation is used to identify that both are made of the same material but are formed at different times.

Figure 37:
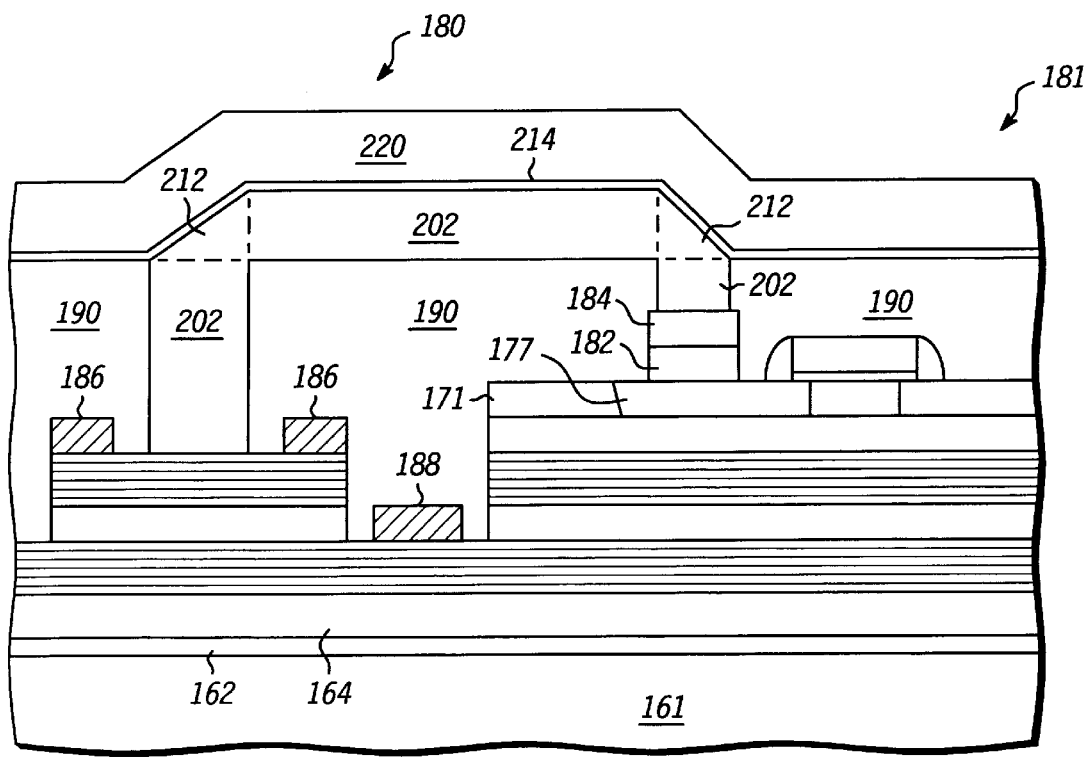

Processing is continued to form a substantially completed integrated circuit as illustrated in FIG. 37. A passivation layer 220 is then formed over the optical laser 180 and MOSFET transistor 181. Although not shown, other electrical or optical connections are made to the components within the integrated circuit but are not illustrated in FIG. 37. These interconnects can include other optical waveguides or may include metallic interconnects.

In other embodiments, other types of lasers can be formed. For example, another type of laser can emit light (photons) horizontally instead of vertically. If light is emitted horizontally, the MOSFET transistor could be formed within the substrate 161, and the optical waveguide would be reconfigured, so that the laser is properly coupled (optically connected) to the transistor. In one specific embodiment, the optical waveguide can include at least a portion of the accommodating buffer layer. Other configurations are possible.

Clearly, these embodiments of integrated circuits having compound semiconductor portions and Group IV semiconductor portions, are meant to illustrate what can be done and are not intended to be exhaustive of all possibilities or to limit what can be done. There is a multiplicity of other possible combinations and embodiments. For example, the compound semiconductor portion may include light emitting diodes, photodetectors, diodes, or the like, and the Group IV semiconductor can include digital logic, memory arrays, and most structures that can be formed in conventional MOS integrated circuits. By using what is shown and described herein, it is now simpler to integrate devices that work better in compound semiconductor materials with other components that work better in Group IV semiconductor materials. This allows a device to be shrunk, the manufacturing costs to decrease, and yield and reliability to increase.

Although not illustrated, a monocrystalline Group IV wafer can be used in forming only compound semiconductor electrical components over the wafer. In this manner, the wafer is essentially a "handle" wafer used during the fabrication of the compound semiconductor electrical components within a monocrystalline compound semiconductor layer overlying the wafer. Therefore, electrical components can be formed within III–V or II–VI semiconductor materials over a wafer of at least approximately 200 millimeters in diameter and possibly at least approximately 300 millimeters.

By the use of this type of substrate, a relatively inexpensive "handle" wafer overcomes the fragile nature of the compound semiconductor wafers by placing them over a relatively more durable and easy to fabricate base material. Therefore, an integrated circuit can be formed such that all electrical components, and particularly all active electronic devices, can be formed within the compound semiconductor material even though the substrate itself may include a Group IV semiconductor material. Fabrication costs for compound semiconductor devices should decrease because larger substrates can be processed more economically and more readily, compared to the relatively smaller and more fragile, conventional compound semiconductor wafers.

A composite integrated circuit may include components that provide electrical isolation when electrical signals are applied to the composite integrated circuit. The composite integrated circuit may include a pair of optical components, such as an optical source component and an optical detector component. An optical source component may be a light generating semiconductor device, such as an optical laser (e.g., the optical laser illustrated in FIG. 33), a photo emitter, a diode, etc. An optical detector component may be a light-sensitive semiconductor junction device, such as a photodetector, a photodiode, a bipolar junction, a transistor, etc.

A composite integrated circuit may include processing circuitry that is formed at least partly in the Group IV semiconductor portion of the composite integrated circuit. The processing circuitry is configured to communicate with circuitry external to the composite integrated circuit. The processing circuitry may be electronic circuitry, such as a microprocessor, RAM, logic device, decoder, etc.

For the processing circuitry to communicate with external electronic circuitry, the composite integrated circuit may be provided with electrical signal connections with the external electronic circuitry. The composite integrated circuit may have internal optical communications connections for connecting the processing circuitry in the composite integrated circuit to the electrical connections with the external circuitry. Optical components in the composite integrated circuit may provide the optical communications connections which may electrically isolate the electrical signals in the communications connections from the processing circuitry.

Together, the electrical and optical communications connections may be for communicating information, such as data, control, timing, etc.

A pair of optical components (an optical source component and an optical detector component) in the composite integrated circuit may be configured to pass information. Information that is received or transmitted between the optical pair may be from or for the electrical communications connection between the external circuitry and the composite integrated circuit. The optical components and the electrical communications connection may form a communications connection between the processing circuitry and the external circuitry while providing electrical isolation for the processing circuitry. If desired, a plurality of optical component pairs may be included in the composite integrated circuit for providing a plurality of communications connections and for providing isolation. For example, a composite integrated circuit receiving a plurality of data bits may include a pair of optical components for communication of each data bit.

In operation, for example, an optical source component in a pair of components may be configured to generate light (e.g., photons) based on receiving electrical signals from an electrical signal connection with the external circuitry. An optical detector component in the pair of components may be optically connected to the source component to generate electrical signals based on detecting light generated by the optical source component. Information that is communicated between the source and detector components may be digital or analog.

If desired the reverse of this configuration may be used. An optical source component that is responsive to the on-board processing circuitry may be coupled to an optical detector component to have the optical source component generate an electrical signal for use in communications with external circuitry. A plurality of such optical component pair structures may be used for providing two-way connections. In some applications where synchronization is desired, a first pair of optical components may be coupled to provide data communications and a second pair may be coupled for communicating synchronization information.

For clarity and brevity, optical detector components that are discussed below are discussed primarily in the context of optical detector components that have been formed in a compound semiconductor portion of a composite integrated circuit. In application, the optical detector component may be formed in many suitable ways (e.g., formed from silicon, etc.).

A composite integrated circuit will typically have an electric connection for a power supply and a ground connection. The power and ground connections are in addition to the communications connections that are discussed above. Processing circuitry in a composite integrated circuit may include electrically isolated communications connections and include electrical connections for power and ground. In most known applications, power supply and ground connections are usually well-protected by circuitry to prevent harmful external signals from reaching the composite integrated circuit. A communications ground may be isolated from the ground signal in communications connections that use a ground communications signal.

Figure 38:
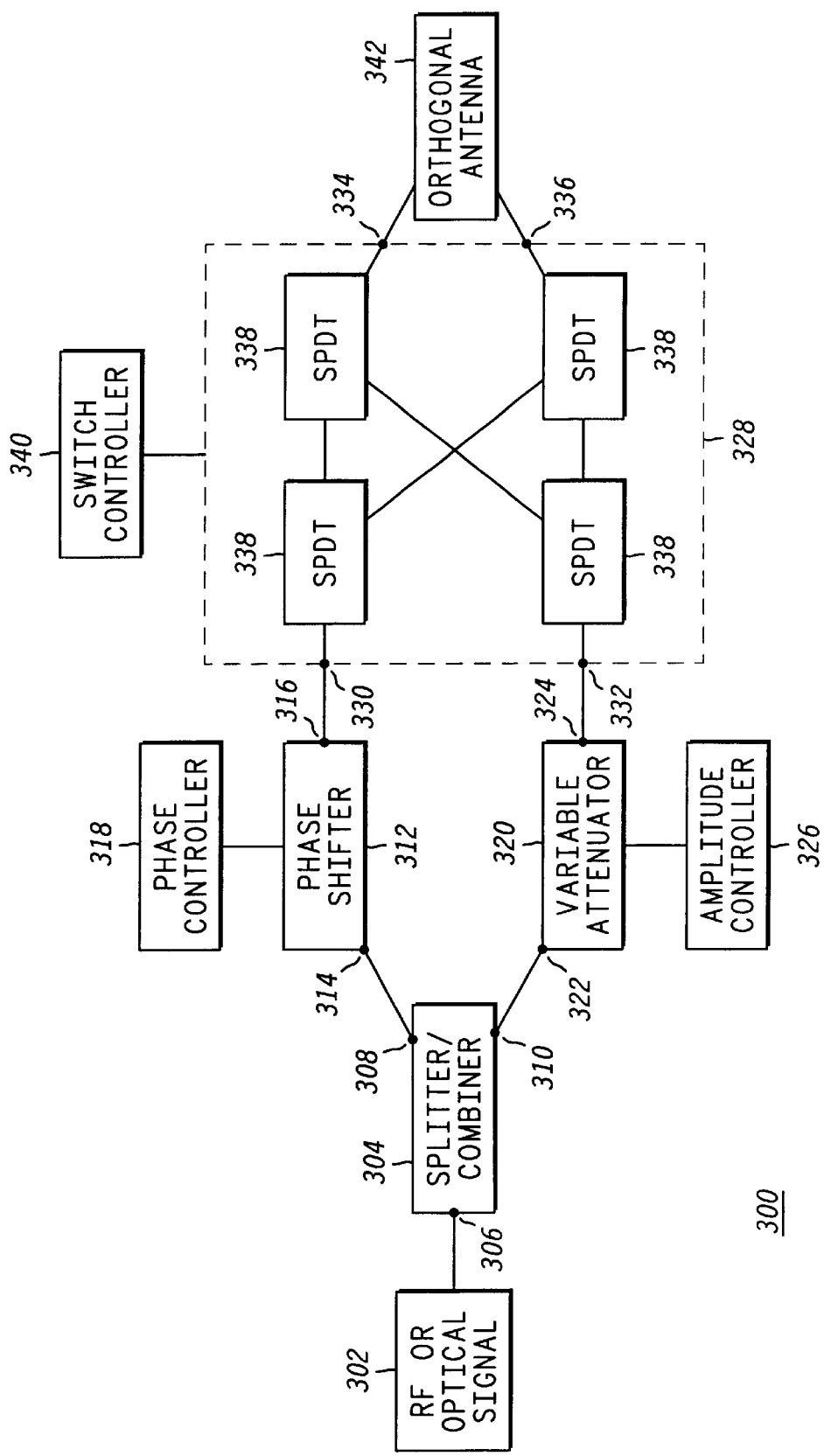
FIG. 38 shows a block diagram of a polarization modulator made in accordance with the present invention.

FIG. 38 shows a block diagram of a polarization modulator made in accordance with the present invention. The polarization modulator provides co- and cross-polarization modulation and demodulation over continuously variable polarization states for transmitting and receiving signals at an orthogonal antenna. For signal transmission, the polarization modulator splits a radio frequency (RF) or optical signal into two equal in-phase signals, phase shifts the first in-phase signal, attenuates the second in-phase signal, providing the phase-shifted signal and variable amplitude signal to a transfer switch, where the signals can be switched between the two feeds of an orthogonal antenna. For signal reception and demodulation, the process is reversed, receiving the desired polarization state of the incoming signal. The two signals from an orthogonal antenna are provided to a transfer switch where the signals can be switched between feeds to a phase shifter and a variable attenuator, which provide a shifted signal and an attenuated signal, respectively, to a combiner. The combiner combines the signals into an RF or optical signal.

The polarization modulator 300 comprises a splitter/combiner 304, a phase shifter 312, a variable attenuator 320, and a transfer switch 328. Controllers for each active component can be built on the semiconductor structure or can be separate from the semiconductor structure. The RF or optical signal 302 at signal connection 306 of the splitter/combiner 304 can be an input or output depending on whether the polarization modulator 300 is used as a transmitter or receiver. The RF or optical signal 302 can be produced by the monocrystalline compound semiconductor material of the semiconductor structures, such as GaAs components, or can be produced separately from the semiconductor structure.

The orthogonal antenna 342 can be a linear, circular, or elliptical antenna, and is connected to the transfer switch 328 at a first orthogonal antenna connection 334 and a second orthogonal antenna connection 336. The orthogonal antenna 342 can be built on the semiconductor structure or can be separate from the semiconductor structure. The orthogonal antenna 342 can provide output from or input to the polarization modulator 300, depending on whether the polarization modulator 300 is used as a transmitter or receiver. Several categories of antennas can be built on the semiconductor structure, with the antennas formed of metal traces on the top layer of the semiconductor structure. For example, linear dipoles or other radiating traces can be provided in a separate arrangement oriented 90° relative to each other, or could look like an "X" with each element fed being horizontally or vertically linear, with the elements themselves not touching. In another example, a microstrip patch antenna can be provided with feeds on two adjacent faces, making it electrically similar to the "X" design. When fed a signal at a first feed that is +90° out of phase with reference to a signal at a second feed, it will have a left circular polarization, and when fed a signal at the first feed that is −90° out of phase with reference to a signal at a second, it will generate a right circular polarization. In another example, a fractal antenna can be employed, using printed radiating elements or arrays of printed radiating elements where the elements take on fractal shapes. Other antenna structures are possible as long as the antennas have symmetry such that their element orientation is orthogonal, or the way in which the elements are fed is orthogonal or the phase relationship along the propagating path causes them to be orthogonal in the far field.

The various components of the polarization modulator 300 can be formed in different layers of the semiconductor structure, depending on the desired application. As shown in FIG. 1, the semiconductor structure 20 can have a monocrystalline substrate 22 and a monocrystalline material layer 26. The monocrystalline substrate 22 can be of, for example, a material from Group IV of the periodic table, and preferably a material from Group IVB. Examples of Group IV semiconductor materials include silicon, germanium, mixed silicon and germanium, mixed silicon and carbon, mixed silicon, germanium and carbon, and the like. The monocrystalline material layer 26 may comprise a compound semiconductor which can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like. However, monocrystalline material layer 26 may also comprise other semiconductor materials, metals, or non-metal materials which are used in the formation of semiconductor structures, devices and/or integrated circuits.

In one embodiment of the polarization modulator 300 of FIG. 38, the splitter/combiner 304, phase shifter 312, and variable attenuator 320 can be formed in a monocrystalline substrate layer of a Group IV material, such as Si. The transfer switch 328 can comprise a plurality of single pole double throw (SPDT) switches 338. The transfer switch 328 can be formed in a monocrystalline substrate layer of a Group IV material, such as Si, and the transfer switch can comprise Micro Electro Mechanical Systems (MEMS) SPDT switches. The transfer switch 328 can alternatively be formed in a monocrystalline semiconductor material layer of Group III–V or Group II–VI materials, such as GaAs. As an alternative to MEMS switches, the transfer switch can comprise FETs, formed in either the substrate layer or the monocrystalline semiconductor material layer of Group III–V or Group II–VI materials. In another embodiment suited for optical applications, splitter/combiner 304, phase shifter 312, variable attenuator 320, and transfer switch 328 can be formed in a monocrystalline semiconductor material layer of Group III–V or Group II–VI materials, such as GaAs. Those skilled in the art will appreciate that these material selections are exemplary only and do not limit the scope of the present invention.

The splitter/combiner 304 can be an equal phase passive device, which can split signal received at signal connection 306 into two signals at first SC connection 308 and second SC connection 310, or combine signals received at first SC connection 308 and second SC connection 310 into one signal at signal connection 306. For RF signals using metal traces, the splitter/combiner 304 can be a Wilkinson splitter/combiner. The first SC connection 308 is connected to the phase shifter 312 at first PS connection 314 and the second SC connection 310 is connected to the variable attenuator 320 at first VA connection 322. In an alternate embodiment, a splitter/combiner can be used that has a prescribed amount of phase shift between the split output sections, such as 90°. The phase shifter described below can then account for the prescribed amount of phase shift.

The phase shifter 312 shifts the phase of a signal between first PS connection 314 and second PS connection 316 in response to a phase control signal from phase controller 318. The phase controller 318 can use variable capacitance control, depending on the frequency involved. The phase controller 318 can be formed in a monocrystalline substrate layer of a Group IV material, such as Si, for lower frequency applications or can alternatively be formed in a monocrystalline semiconductor material layer of Group III–V or Group II–VI materials, such as GaAs, for higher frequency applications. The second PS connection 316 is connected to the transfer switch 328 at first TS connection 330.

The variable attenuator 320 changes the amplitude of a signal between first VA connection 322 and second VA connection 324 in response to the amplitude control signal from amplitude controller 326. The amplitude controller 326 can be formed in a monocrystalline substrate layer of a Group IV material, such as Si. The second VA connection 324 is connected to the transfer switch 328 at second TS connection 332.

The transfer switch 328 switches between a first transfer switch state and a second transfer switch state in response to a switch control signal from switch controller 340. In a first transfer switch state, first TS connection 330 is connected to the first orthogonal antenna connection 334, and the second TS connection 332 is connected to the second orthogonal antenna connection 336. In a second transfer switch state, first TS connection 330 is connected to the second orthogonal antenna connection 336, and the second TS connection 332 is connected to the first orthogonal antenna connection 334. The transfer switch 328 can comprise a plurality of single pole double pole (SPDT) switches 338 functionally cross-wired to switch between connections. The individual SPDT switches 338 can be similar in capacitance and switching characteristics to provide smooth switching and avoid signal distortion. The SPDT switches 338 can be formed in a monocrystalline substrate layer of a Group IV material, such as Si, if slower switching using Micro Electro Mechanical Systems (MEMS) is adequate. MEMS switches can be fabricated from silicon and silicon compounds using semiconductor chip etching and deposition techniques. Alternatively, the SPDT switches 338 can be formed as FETs in a monocrystalline semiconductor material layer of Group III–V or Group II–VI materials, such as GaAs, if fast switching is required. The switch controller 340 can be formed in a monocrystalline substrate layer of a Group IV material, such as Si. The phase controller 318 can be formed in a monocrystalline substrate layer of a Group IV material, such as Si, for lower frequency applications or can alternatively be formed in a monocrystalline semiconductor material layer of Group III–V or Group II–VI materials, such as GaAs, for higher frequency applications. Other mechanisms able to accomplish the transfer-switching task are available and well known to those skilled in the art. First orthogonal antenna connection 334 and second orthogonal antenna connection 336 can be connected to the orthogonal antenna 320.

For signal transmission, the splitter/combiner 304 splits RF or optical signal 302 into a first in-phase signal and a second in-phase signal. The phase shifter 312 phase shifts the first in-phase signal to form a phase-shifted signal, to provide a variable phase shift relative to the attenuated signal path. The variable attenuator 320 attenuates the second in-phase signal to form a variable amplitude signal, to provide a variable attenuation relative to the phase-shifted signal path. The transfer switch 328 switches the phase-shifted signal and the variable amplitude signal between the first orthogonal antenna connection 334 and second orthogonal antenna connection 336.

For signal reception and demodulation, first orthogonal antenna signal at first orthogonal antenna connection 334 and second orthogonal antenna signal at second orthogonal antenna connection 336 are provided to transfer switch 328. The transfer switch 328 switches the first orthogonal antenna signal and the second orthogonal antenna signal between the phase shifter 312 and the variable attenuator 320. The phase shifter 312 forms a shifted signal and the variable attenuator 320 forms an attenuated signal. The splitter/combiner 304 combines the shifted signal and attenuated signal into an RF or optical signal 302.

The action of the transfer switch 328 in response to the switch control signal allows the polarization modulator 300 to switch from one state of polarization (SOP) to the orthogonal SOP. With the transfer switch 328 set so that the signals proceed straight across, i.e., in the first switch state so that the phase-shifted signal is connected to the first orthogonal antenna connection 334 and the variable amplitude signal is connected to the second orthogonal antenna connection 336, the polarization modulator 300 can cover one hemisphere of the Poincare sphere, but not both hemispheres. The phase shifter 312 and variable attenuator 320 cover the single hemisphere in response to the phase control signal and amplitude control signal, respectively. By switching to the second transfer switch state, with the phase-shifted signal connected to the second orthogonal antenna connection 336 and the variable amplitude signal connected to the first orthogonal antenna connection 334, the polarization modulator 300 covers the alternate hemisphere of the Poincare sphere from that covered in the first transfer switch state. Thus, the transfer switch 328 allows the polarization modulator 300 to continuously cover the whole Poincare sphere and to modulate between orthogonal states of polarization in the opposite hemispheres. By combinational control of the attenuator and phase shifter networks, all polarizations from circular to linear and elliptical can be produced.

Figure 39:
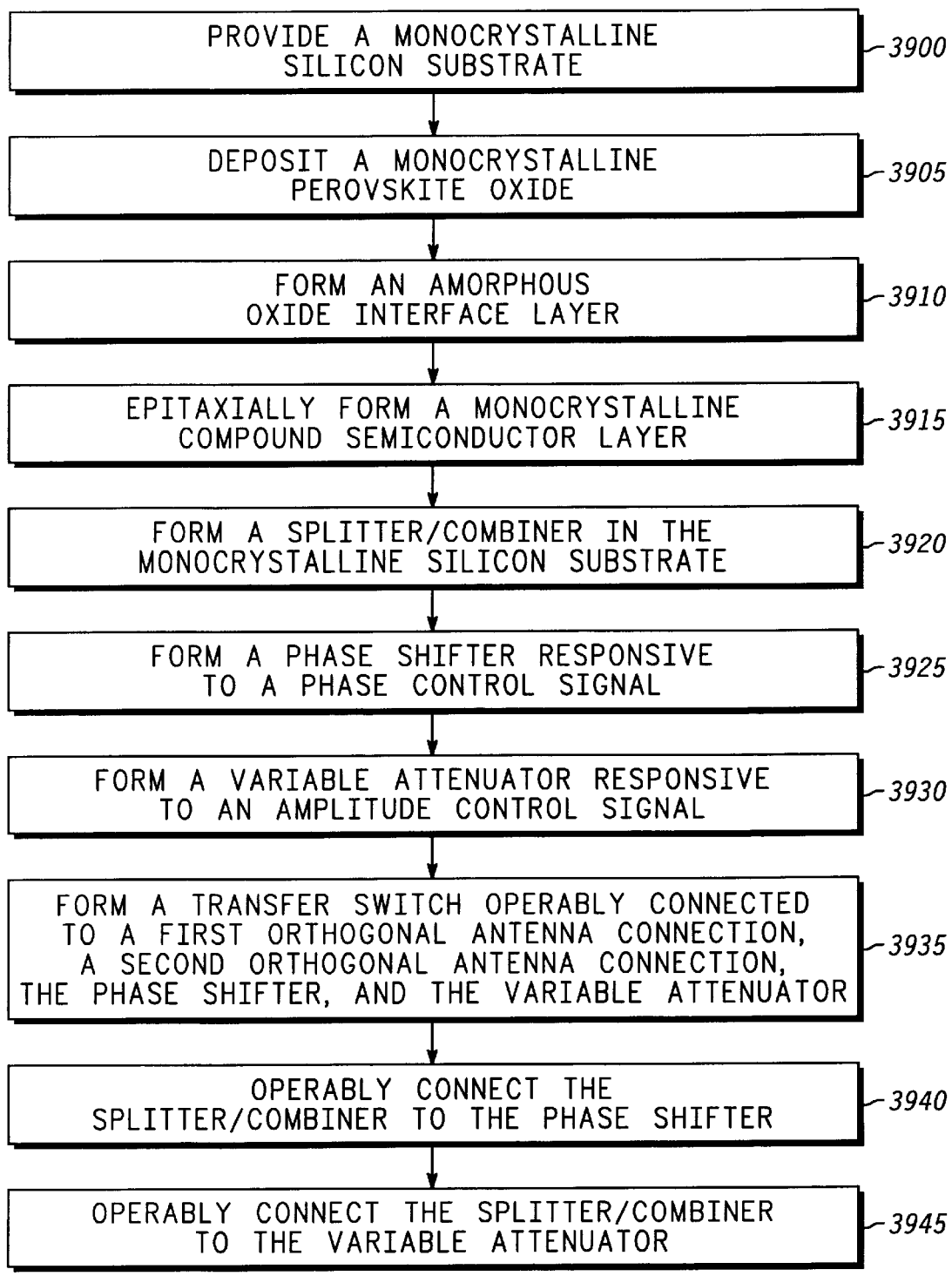

Referring now to FIG. 39, a flow chart shows some steps of a process for fabricating a semiconductor structure having a polarization modulator, using the techniques described in this disclosure. Some steps that have been described herein above and some steps that are obvious to one of ordinary skill in the art are not shown in the flow chart, but would be used to fabricate the semiconductor. At step 3900, a monocrystalline silicon substrate is provided, meaning that the substrate is prepared for use in equipment that is used in the next step of the process. A monocrystalline perovskite oxide film is deposited overlying the monocrystalline silicon substrate at step 3905, the film having a thickness less than a thickness of the material that would result in strain-induced defects. An amorphous oxide interface layer is formed at step 3910, containing at least silicon and oxygen at an interface between the monocrystalline perovskite oxide film and the monocrystalline silicon substrate. At step 3915, a monocrystalline compound semiconductor layer is epitaxially formed overlying the monocrystalline perovskite oxide film. At step 3920 splitter/combiner is formed in the monocrystalline silicon substrate. At step 3925 a phase shifter responsive to a phase control signal is formed. At step 3930 a variable attenuator a responsive to an amplitude control signal is formed.

At step 3935, a transfer switch is formed having a first TS connection, a second TS connection, a first orthogonal antenna connection, and a second orthogonal antenna connection; the first TS connection and the first orthogonal antenna connection being operably connected in a first transfer switch state; the second TS connection and the second orthogonal antenna connection being operably connected in the first transfer switch state; the first TS connection and the second orthogonal antenna connection being operably connected in a second transfer switch state; the second TS connection and the first orthogonal antenna connection being operably connected in the second transfer switch state; the transfer switch responsive to a switch control signal for switching between the first transfer switch state and the second transfer switch state. The splitter/combiner is operably connected at step 3940 to the phase shifter. The splitter/combiner is operably connected at step 3945 to the variable attenuator. The phase shifter is operably connected at step 3950 to the first TS connection. The variable attenuator is operably connected at step 3955 to the second TS connection.

As will be appreciated by those skilled in the art, there are numerous applications for a polar modulator having the ability to switch to any polarization on the whole Poincare sphere. The descriptions of uses presented below are exemplary only and are not intended to limit the scope of the present invention.

First, it is possible to optimize transmission from or reception on a hand-held device using an orthogonal antenna, such as a cellular telephone. Because the present invention can reach any state of polarization, the polar modulator can adjust for the antenna's physical orientation to provide the best connection independent of how the hand-held device is held.

Second, it is possible to use rapid co- and cross-polar modulation to provide and increase information transfer capability. Polar modulation of radar signals can provide additional information on the size and shape of remote objects due to the rapid switching of SOP made possible by the present invention. Polarization modulation of communication signals can provide additional information bandwidth for applications such as required for the next generation of hand-held wireless devices combining text and graphic content, generally known as 3G wireless devices, due to the ability to modulate over all SOPs.

While the above embodiments have been described primarily in terms of RF signals and components, one skilled in the art will recognize that the invention is also applicable to optical signals and devices analogous to the RF signals and components described. There are functional equivalents for all of the individual components mentioned, i.e., splitters, phase-shifters, variable attenuators, SPDT switches, and polarization-sensitive feed structures, but in differently-realizable mechanisms. Similarly, the polarization modulator can be used as a transmitter or receiver. In an alternate embodiment, the phase shifter and attenuator control mechanisms can both be provided on one branch of the splitter/combiner, with the other branch being a straight connection to the transfer switch with no active components. The straight connection branch can have its branch loss matched to the control mechanisms branch when the control mechanisms are set to their minimum settings, i.e., lowest loss and shortest phase setting. The devices discussed herein are for illustration only and are not intended to limit the scope of the invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

I claim:

1. A system for polarization modulation of an RF or optical signal for transmission comprising:
    means for splitting the RF or optical signal into a first in-phase signal and a second in-phase signal;
    means for phase shifting the first in-phase signal into a phase-shifted signal in response to a phase control signal;
    means for attenuating the second in-phase signal into a variable amplitude signal in response to an amplitude control signal; and
    means for switching between a first transfer switch state and a second transfer switch state in response to a switch control signal;
    wherein the switching means in the first transfer switch state directs the phase-shifted signal to a first orthogonal antenna connection and the variable amplitude signal to a second orthogonal antenna connection; and the switching means in the second transfer switch state directs the phase-shifted signal to the second orthogonal antenna connection, and the variable amplitude signal to the first orthogonal antenna connection.

2. The system of claim 1 further comprising means for transmitting the phase-shifted signal from the first orthogonal antenna connection and the variable amplitude signal from the second orthogonal antenna connection.

3. A system for polarization modulation for reception of a first orthogonal antenna signal and a second orthogonal antenna signal comprising:
    means for orthogonal antenna signal phase shifting in response to a phase control signal, the orthogonal antenna signal phase shifting means providing a shifted signal;
    means for orthogonal antenna signal attenuating in response to an amplitude control signal, the orthogonal antenna signal attenuating means providing an attenuated signal;
    means for combining the shifted signal and the attenuated signal; and
    means for switching between a first transfer switch state and a second transfer switch state in response to a switch control signal;
    wherein the switching means in the first transfer switch state directs the first orthogonal antenna signal to the orthogonal antenna signal phase shifting means and the second orthogonal antenna signal to the orthogonal antenna signal attenuating means; and the switching means in the second transfer switch state directs the second orthogonal antenna signal to the orthogonal antenna signal phase shifting means and the first orthogonal antenna signal to the orthogonal antenna signal attenuating means.

4. The system of claim 3 further comprising means for receiving the first orthogonal antenna signal at the first orthogonal antenna connection and the second orthogonal antenna signal at the second orthogonal antenna connection.

* * * * *